(12) United States Patent
Adomaitis

(10) Patent No.: US 7,632,542 B2
(45) Date of Patent: Dec. 15, 2009

(54) METHOD FOR CONTROLLING UNIFORMITY OF THIN FILMS FABRICATED IN PROCESSING SYSTEMS

(75) Inventor: Raymond A. Adomaitis, Washington, DC (US)

(73) Assignee: University of Maryland, College Park, MD (US)

( * ) Notice: Subject to any disclaimer, the term of this patent is extended or adjusted under 35 U.S.C. 154(b) by 429 days.

(21) Appl. No.: 11/585,793

(22) Filed: Oct. 25, 2006

(65) Prior Publication Data

US 2007/0090091 A1  Apr. 26, 2007

Related U.S. Application Data

(60) Provisional application No. 60/730,532, filed on Oct. 26, 2005.

(51) Int. Cl.
G06F 19/00 (2006.01)
C23C 16/00 (2006.01)

(52) U.S. Cl. .................. 427/248.1; 700/121; 427/8; 118/715

(58) Field of Classification Search .............. 427/8
See application file for complete search history.

(56) References Cited

U.S. PATENT DOCUMENTS

| | | |
|---|---|---|
| 4,858,556 A | 8/1989 | Siebert |
| 5,250,116 A | 10/1993 | Tanimoto |
| 5,308,447 A | 5/1994 | Lewis et al. |
| 5,393,624 A | 2/1995 | Ushijima |
| 5,399,229 A | 3/1995 | Stefani et al. |
| 5,911,858 A | 6/1999 | Ruffner |
| 5,939,130 A | 8/1999 | Shiraishi et al. |
| 6,249,712 B1 | 6/2001 | Boiquaye |
| 6,376,013 B1 | 4/2002 | Rangarajan et al. |
| 6,563,578 B2 | 5/2003 | Halliyal et al. |
| 6,616,818 B2 | 9/2003 | Gibson |
| 6,620,301 B1 | 9/2003 | Braeckelmann |
| 6,623,606 B2 | 9/2003 | Hurwitt et al. |
| 6,689,255 B2 | 2/2004 | Baldwin et al. |
| 6,801,326 B2 | 10/2004 | Finarov et al. |
| 6,866,763 B2 | 3/2005 | Basol et al. |
| 6,913,938 B2 | 7/2005 | Shanmugasundram et al. |
| 6,984,477 B2 | 1/2006 | Ogata et al. |

(Continued)

OTHER PUBLICATIONS

Adomaitis, R. A.; "Objects for MWR"; Computers & Chemical Engineering, 2002, 26 (7-8), pp. 981-998.

*Primary Examiner*—Timothy H Meeks
*Assistant Examiner*—Joseph Miller, Jr.
(74) *Attorney, Agent, or Firm*—Rosenberg, Klein & Lee

(57) ABSTRACT

A method for spatial uniformity control in thin film processing is devised which is applicable to any film quality (thickness, composition, microstructure, electrical properties, etc.) as well as to all deposition systems (CVD, PVD, etch, ALD, etc.) where the substrate is rotated to improve uniformity of the deposited thin films. The technique is based on identifying the subspace of all deposition profiles on the stationary substrate that produce uniform films under rotation and then projecting a deposition profile to be controlled onto a sequence of uniformity—producing basis functions spanning that subspace to determine the Nearest Uniformity Producing Profile (NUPP). The process parameters as well as reactor design are optimized in order to minimize uniformity optimization criterion defined as a deviation of a produced deposition profile on the stalled substrate from the NUPP.

13 Claims, 22 Drawing Sheets

U.S. PATENT DOCUMENTS

| | | |
|---|---|---|
| 7,078,344 B2 | 7/2006 | Bailey, III et al. |
| 2002/0008891 A1 | 1/2002 | Mearini et al. |
| 2002/0139678 A1 | 10/2002 | Wilson et al. |
| 2003/0017256 A1 | 1/2003 | Shimane |
| 2003/0049376 A1 | 3/2003 | Schwarm et al. |
| 2004/0007560 A1 | 1/2004 | Sakano et al. |
| 2006/0144335 A1 | 7/2006 | Lee et al. |

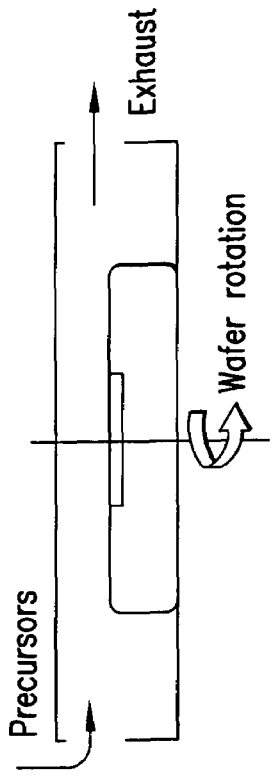
FIG. 1A
PRIOR ART
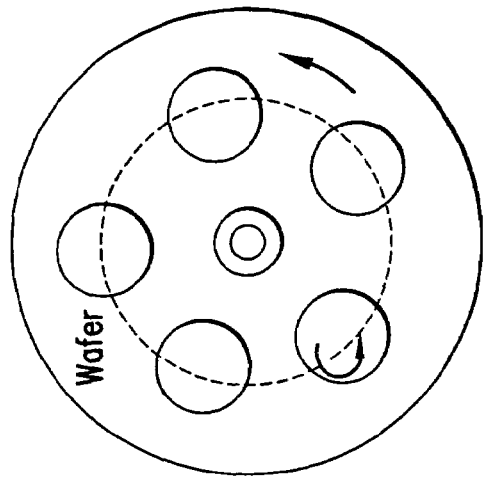
FIG. 1C
PRIOR ART
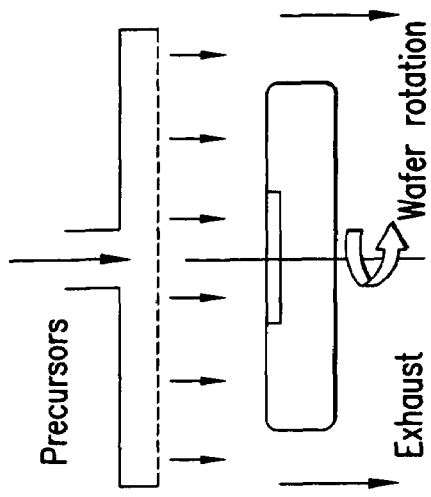
FIG. 1B
PRIOR ART
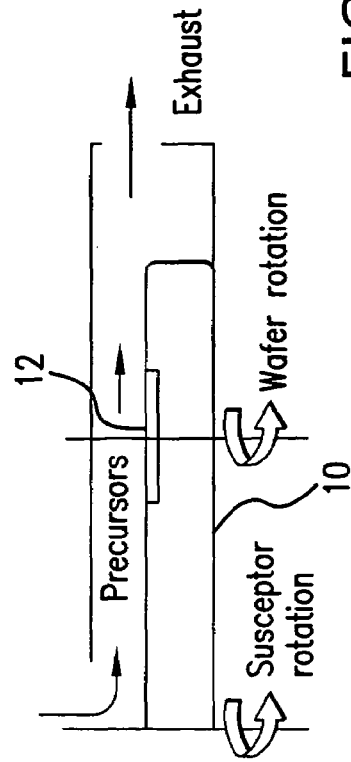

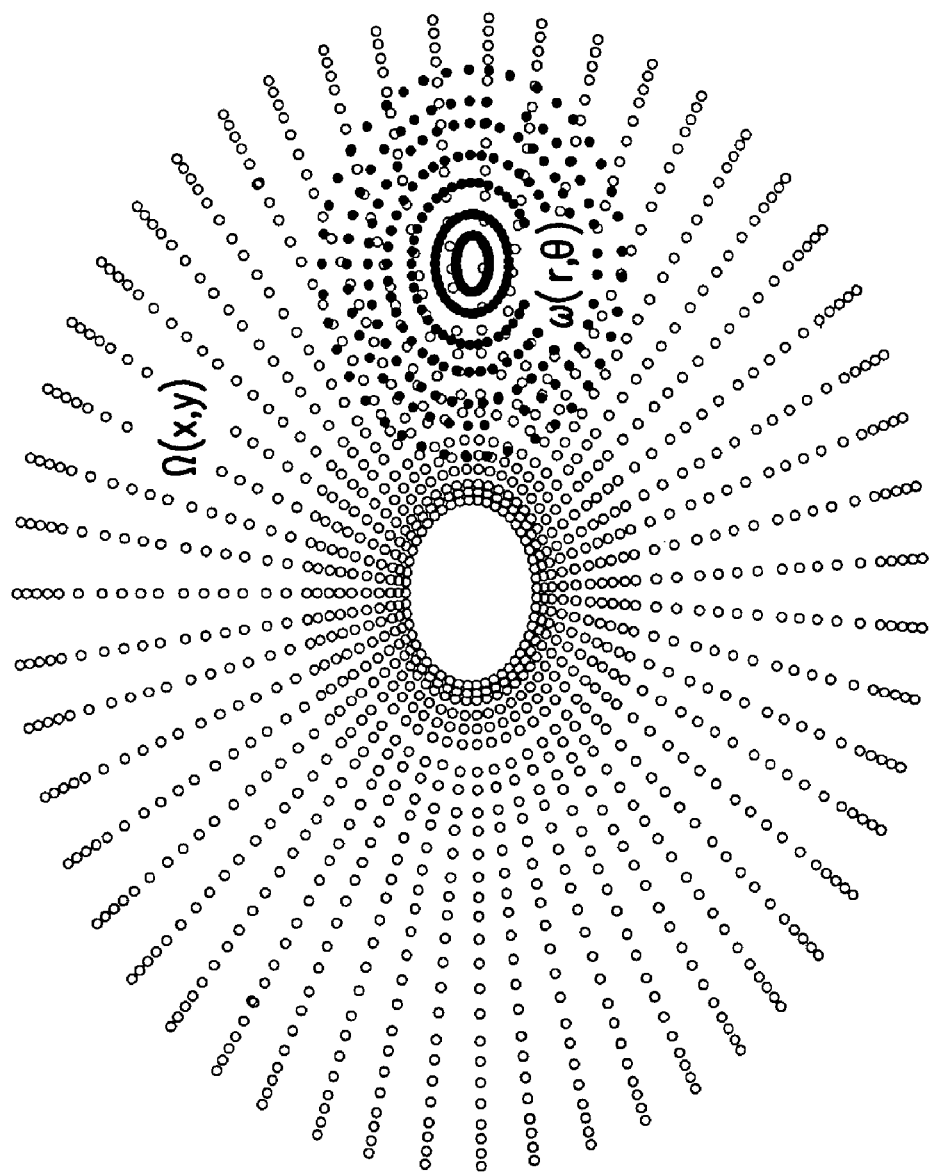

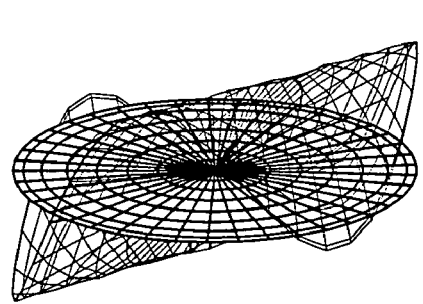
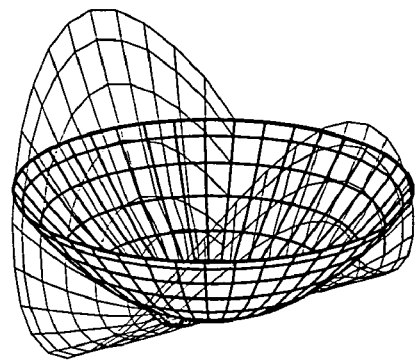
FIG.11A    FIG.11B
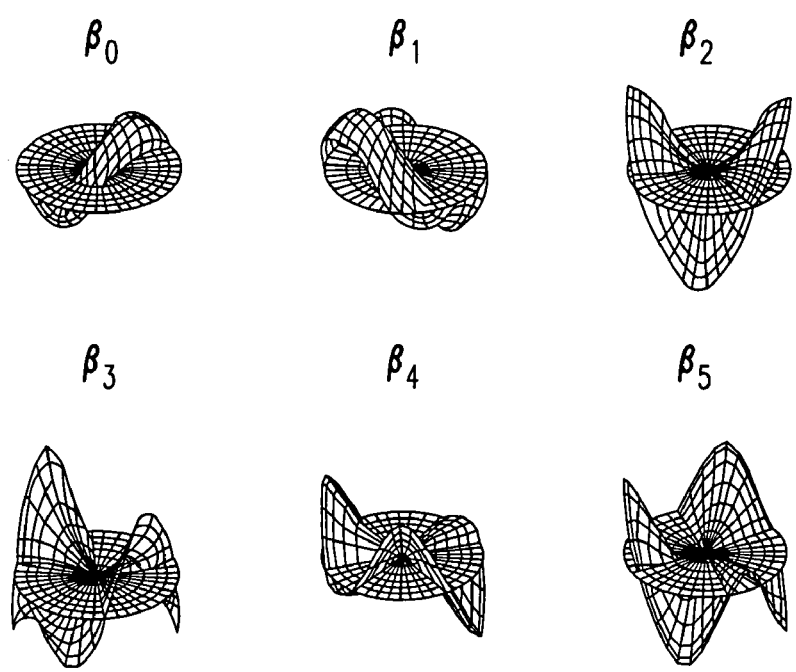
FIG.12

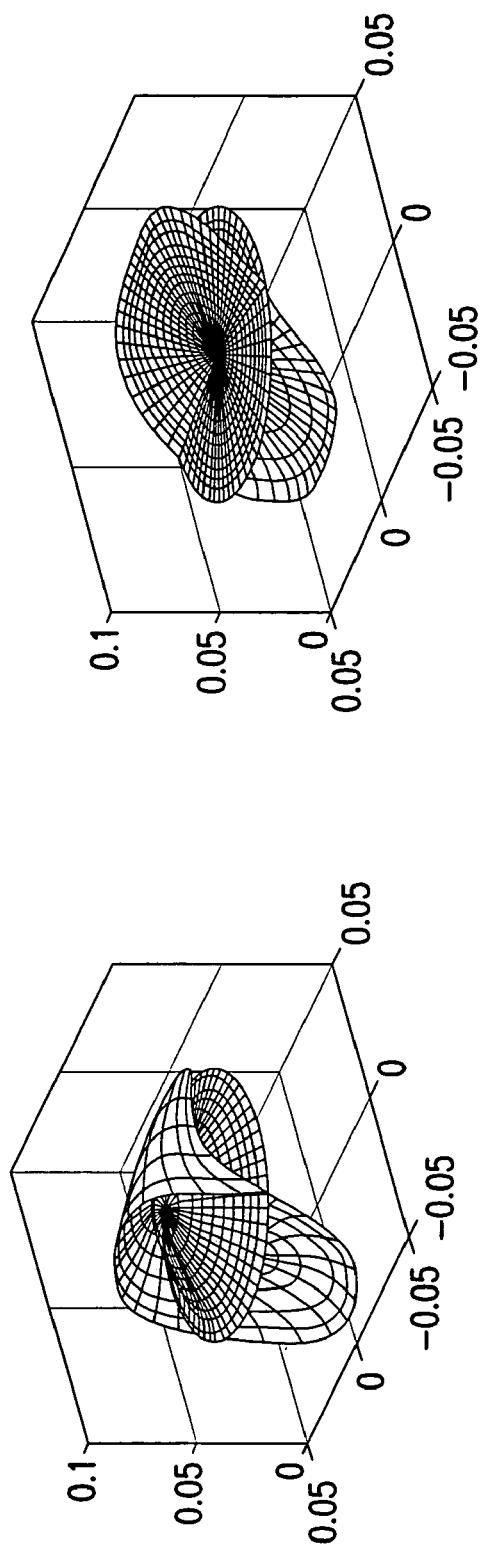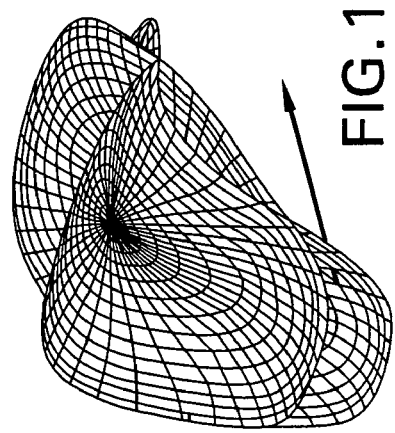
FIG. 13C
FIG. 13D
FIG. 13B

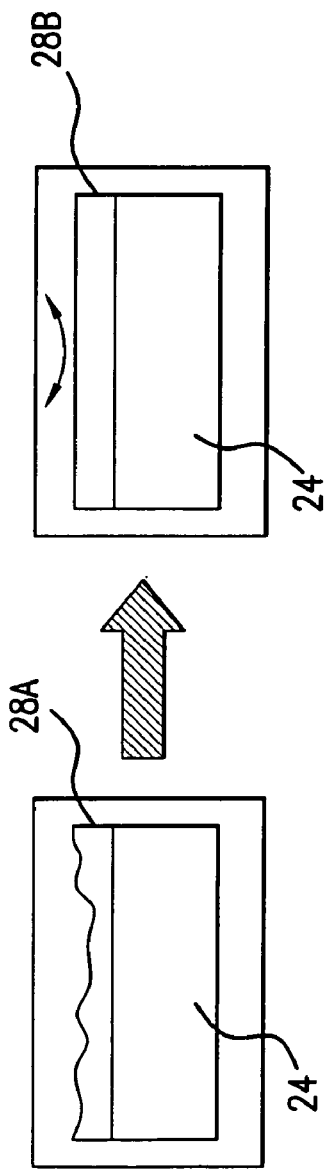
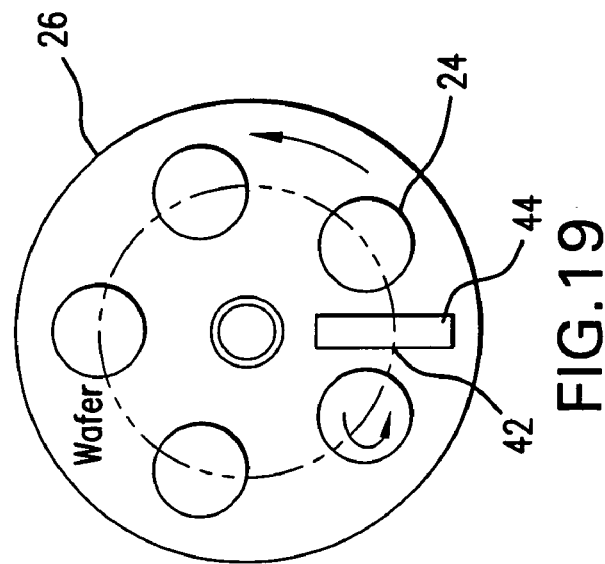
FIG. 16A
FIG. 16B
FIG. 19

METHOD FOR CONTROLLING UNIFORMITY OF THIN FILMS FABRICATED IN PROCESSING SYSTEMS

The subject utility Patent Application is based on the Provisional Patent Application Ser. No. 60/730,532 filed 26 Oct. 2005.

FIELD OF THE INVENTION

The present invention relates to thin film fabrication, and in particular to fabrication of highly uniform thin films in processing systems employing substrate rotation.

The overall concept of the present invention relates to a control of spatial uniformity of thin films applicable to a broad range of film quality parameters, e.g. thickness, composition, dopant levels, microstructure, electrical properties, morphology, etc., and for unlimited spectrum of thin film processing systems where a substrate (wafer) is rotated to improve thin film uniformity. One aspect of the novel uniformity control technique is that it is based on a minimal number of physical assumptions, resulting in a technique applicable to a wide range of thin film processing control, optimization, and design applications. The uniformity control technique is applicable to, but not limited to all systems using chemical vapor deposition (CVD), etch, PVD (physical vapor deposition), atomic layer deposition (ALD) and any other thin film process employing a rotated substrate which gives the technique an extremely broad industrial impact.

Further, the present invention is related to a uniformity control technique which is based on identifying a subspace of all deposition profiles on the stationary (stalled) substrate that produces uniform films under rotation, by projecting a deposition profile to be controlled onto a sequence of uniformity-producing basis functions, and determining the "Nearest Uniformity Producing Profile" (NUPP). This mathematical criterion depends only on the geometrical characteristics of the thin film processing system. A deviation of the real profile of the thin films formed from the NUPP is minimized substantially to zero in the present uniformity optimization technique in order to attain the spatial uniformity of the thin films through adjustment and control of the process and/or design parameters of thin film processing systems.

BACKGROUND OF THE INVENTION

Rapid evolution of material systems and continued tightening of quality control constraints for thin-film manufacturing processes in semiconductor and other (e.g., optical coating) industries pose a number of challenges to equipment design, giving rise to a wide range of reactor systems designed to reduce spatial non-uniformity of deposition thickness, composition, microstructure and other quality parameters of thin films. In some manufacturing processes, the use of substrate (wafer) rotation is integral to achieving acceptable film properties across the substrate. In Chemical Vapor Deposition (CVD) systems commonly used for semiconductor processing numerous reactor designs make use of wafer rotation, such as 1. cross-flow reactor designs shown in FIG. 1A, where gas flows through a tube or duct-shaped reactor chamber over a wafer and exhausts opposite the gas inlet where wafer rotation is used to reduce cross-flow deposition non-uniformities and depletion effects in the direction of flow;

2. cylindrical reactors shown in FIG. 1B, in which gas flows from a shower head over a wafer and exhausts from the bottom, where wafer rotation is used to eliminate any residual angular non-uniformities in the reactor design; and 3. planetary reactors shown in FIGS. 1C-1D, where gas flows radially outward from a central feed point over a susceptor containing multiple wafers. As the gas flows over the hot susceptor, thermal decomposition and gas phase and surface reactions take place, some of which result in film deposition of the desired material, while other reactions lead to the formation of gas-phase adducts and deposits on reactor walls and other surfaces.

Due to depletion and the manner in which decomposition reactions take place in this reactor geometry, radial flow designs inherently produce non-uniform deposition patterns with respect to the radial coordinate of the reactor. In an effort to overcome this limitation, some reactor designs incorporate a substrate planetary motion mechanism as part of the susceptor assembly to compensate for the depletion and other radial and azimuthal variations in CVD reactor systems as shown in FIG. 1C. In these reactors, the relatively large susceptor 10 rotates around its center point and each wafer 12 rotates independently of the susceptor. This combination of rotating motions results in points on each wafer tracing out a cycloid-like pattern partially compensating for the non-uniform deposition profile. Typically, these reactors can be operated with rotating wafers or stalled (non-rotating) wafers. This design has the effect of eliminating reactor-induced angular non-uniformity generators through susceptor rotation. Wafer rotation is used to reduce the intrinsic (and completely unavoidable) effect of gas phase reactant decomposition and precursor depletion in the gas phase.

The physical and electrical properties of SiC and group-III nitrides (e.g., AlN, GaN, InN, and their alloys) make these materials ideal for high-frequency, high-power electronic devices as well as optoelectronic applications. For example, gallium nitride (GaN), a compound semiconductor material, has shown potential in electronic and optoelectronic devices over the past few years due to its wide-bandgap and high breakdown field properties. GaN has a direct bandgap of 3.4 eV making it suitable for manufacturing light emitting diodes (LEDs) capable of emitting light of any wavelength between blue and ultraviolet (UV) when alloyed with indium (In) and aluminum (Al). In addition, GaN-based devices are used for high-frequency and/or high-power applications including aircraft radar electronics.

Metalorganic vapor phase epitaxy (MOVPE) is the principal method used to grow single-crystalline layers of this material. Currently, manufacturers of gallium nitride devices use both commercial and custom-built reactor designs. The wide range of reactor designs indicates a lack of a coherent framework on how to design gallium nitride reactors for optimal single wafer and multiple-wafer production. As a result, significant research from both academic and industrial levels has enhanced manufacturing technology considerably within the past decade.

Despite ongoing research in this area, an unambiguous understanding of the physical and chemical mechanisms governing the deposition process is still lacking. The difficulties in achieving this understanding to a certain extent can be linked to the complex intrinsic chemistry of the deposition process, the knowledge of which currently is incomplete. A large number of gas phase and surface phase reactions resulting from the extreme conditions necessary for gallium nitride growth have been extensively studied by many researchers. As a result, a number of chemical mechanisms describing important gas phase and surface phase reactions during GaN growth have been reported in the literature. Though most of these mechanisms present similar reaction pathways, the distinguishing factors are the individual rate parameters. In addition, some research groups assume significant gas phase reactions, whereas others assume gas phase reactions play no role in film deposition kinetics. A consensus of a definitive kinetic model describing gallium nitride growth has yet to be reached.

Gas phase gallium nitride chemistry may be visualized as consisting of two competing routes: an a) upper route and b) lower route. The upper route is more commonly referred to as the adduct formation pathway, whereas, the lower route refers to the thermal decomposition pathway of TMG (Trimethylgallium). Each pathway is responsible for producing an array of chemical species that may eventually participate in GaN deposition. The primary gas phase reaction is the spontaneous interaction between commonly used precursors, trimethylgallium (($CH_3$)$_3$Ga) and ammonia ($NH_3$), to form stable acid-Lewis base adducts. Adduct formation is a ubiquitous problem during MOVPE of GaN and has been widely studied. Upon formation, these adducts may condense on cold surfaces inside the reactor system. For this reason, the formation of these adducts is believed to degrade film quality, uniformity, and consume the feed stream of organometallic sources.

Consequently, numerous research groups have designed reactor systems, in particular gas delivery systems, with the intent to minimize precursor interactions. The most common approach has been to use separate injectors to reduce any premature mixing of the precursors. Reactor systems of this type have been developed by SUNY/Sandia/Thomas Swann researchers to illustrate a connection between gas phase reactions and film-thickness uniformity. It should be noted that while these designs are able to suppress reactions in the gas delivery system, complete mixing of the precursors must take place close to the wafer surface to achieve uniform film thickness.

More novel approaches to the optimization of GaN CVD are based on optimization of two objective functions that span multiple length scales which are performed simultaneously to maximize thickness uniformity (macroscopic objective) and minimize surface roughness across wafer surface (microscopic objective). Additionally, a strategy for nonlinear programming problems that involved PDE models has been developed and applied to a detailed GaN CVD model where the objective was to optimize operating conditions that produced thin films of GaN with spatially uniform thickness.

While a number of simulation-based optimization studies have been performed on existing reactor systems, none of them however have addressed a fundamental question of whether the non-uniform deposition profiles exist in the reactor radial coordinate which produce perfectly flat deposition profiles on the rotated wafers.

SUMMARY OF THE INVENTION

An object of the present invention is to provide a method for controlling spatial uniformity of thin films which is universally applicable to any quality parameter of thin films (thickness, composition, microstructure, morphology, electrical properties, etc.) fabricated in a film processing system (including CVD, etch, PVD, ALD, etc.) with substrate rotation.

It is a further object of the present invention to identify non-uniform deposition profiles of thin films formed on stalled substrates which produce uniform thin film profiles upon the rotation of the substrates and to adjust fabrication process and reactor design parameters accordingly to obtain such identified non-uniform deposition profiles on the stalled substrate in the optimized fabrication process and reactor.

It is an additional object of the present invention to develop an unambiguous uniformity criterion, e.g. a "Nearest Uniformity Producing Profile" (NUPP) independent of a nature of thin films or processing systems, which permits to formulate an optimization criterion defined as the minimization of deviation of a produced deposition profile from the NUPP.

In the novel method for controlling the uniformity of produced thin films, a numerical analysis procedure begins by defining a sequence of orthogonal, complete functions over the region of a reactor where wafers are located. Subsequently, each orthogonal complete function is projected, in sequence, onto the wafers physical domain, and the rotation-averaged transformed functions are determined. Using the Singular-Value Decomposition (SVD) method to define an orthogonal basis for the rotation-averaged functions, it is further determined which combinations of the new basis functions best approximate a flat film profile. This approach is used to find a sequence of modes, each of which generates perfectly flat profiles under rotation.

Due to the fact that linear combinations of the final sets of modes $\beta_n$ generate flat profiles, these $\beta_n$ are used to generate a useful basis onto which a deposition profile can be projected to immediately determine whether the particular profile will generate uniform films under rotation, and if it does not, predict the shape of the "nearest" profile that does. Likewise, these modes $\beta_n$ can be used as a part of an efficient mechanism of optimizing the deposition process for uniformity.

Specifically, the method of the present invention for improving uniformity of thin films formed in a thin film processing system comprises the steps of:

providing a thin film processing system including at least one substrate operated in a stalled substrate mode and in a rotating substrate mode, providing a computation system operationally coupled to said film processing system, identifying a first distribution profile of a parameter under investigation of a thin film formed on the stalled substrate which produces a uniform second distribution profile of the thin film upon substrate rotation in the rotating substrate mode;

computing a subspace of basis functions $\beta_n$ corresponding to the first distribution profile;

formulating a uniformity optimization criterion defined as a deviation of a deposition profile of the parameter under investigation from the subspace of the basis functions $\beta_n$; and optimizing the thin film processing system to minimize the uniformity optimization criterion substantially to zero.

To formulate the uniformity optimization criterion, a Nearest Uniformity Producing Profile (NUPP) $N_u(r,\theta)$ is formed which is based on the subspace of basis function $\beta_n$, wherein $$N_u(r, \theta) = \sum_{n=0}^{N} \beta_n(r, \theta) \int_0^{2\pi} \int_0^{r_\omega} \delta(r, \theta) \beta_n(r, \theta) r \, dr \, d\theta$$

wherein $\beta_n(r,\theta)$ is the basis function corresponding to the first distribution profile, $\delta(r,\theta)$ is the deposition profile of the parameter under investigation, and r and $\theta$ are parameters of the substrate physical domain $\omega(r,\theta)$.

The uniformity optimization criterion $S(r,\theta) = \delta(r,\theta) - N_u(r, \theta)$ is calculated at a predetermined region of the thin film.

A film profile under investigation $\Delta(x, y)$ is projected onto the physical domain $\omega(r,\theta)$ of the substrate, wherein $\Delta(x, y)$ represents the parameter under investigation of said thin film, thus defining the deposition profile $\delta(r,\theta)$ of said parameter, wherein $$\delta(r,\theta) = \sum_{i,j}^{I,J} a_{i,j} p_{i,j}(r,\theta)$$

wherein $p_{i,j}(r,\theta)$ are representations of said deposition profile $\delta(r,\theta)$ over said physical domain $\omega(r,\theta)$ of the substrate, and $\alpha_{i,j}$ are contribution coefficients.

Further, rotation—averaged functions $\bar{\delta}(r,\theta)$ are determined which correspond to said $\delta(r,\theta)$, wherein $$\bar{\delta}(r,\theta) = R\delta(r,\theta) = \sum_{i,j=1}^{I,J} a_{i,j}\alpha_{i,j}(r),$$

wherein R is a rotationally—averaging operator, and $\alpha_{i,j}(r)$ are representations of rotationally averaged functions corresponding to $p_{i,j}(r,\theta)$.

A subset $\{\hat{p}\}_{n=1}^n$ of all said $p_{i,j}(r,\theta)$ is selected which corresponds to non-uniform and non-zero $\hat{\alpha}_{i,j}(r)$ from $\alpha_{i,j}(r)$ for further computation to define uniformity producing modes $\{\beta_n\}_{n=0}^N$ of the subspace span $\{\hat{p}\}$ corresponding to all non-zero profiles of the parameter under investigation of the thin film formed on the substrate in the stalled substrate mode producing uniform thin film upon rotation of the substrate.

The present invention is also directed to a thin film processing system for fabrication of thin films of high uniformity. The system includes:

a processing chamber, and a computation system operationally coupled to the processing chamber which includes a thin film uniformity optimization and control unit.

The uniformity optimization and control unit comprises:

(a) a first unit identifying at least one first distribution profile of at least one parameter of a thin film formed on a stalled substrate which produces a uniform second distribution profile of the parameter upon substrate rotation;

(b) a second unit computing a subspace of basis functions $\beta_n$ corresponding to the first distribution profile generating a uniform second distribution profile;

(c) a third unit forming a Nearest Uniformity Producing Profile (NUPP) $N_u(r,\theta)$ based on the subspace of basis function $\beta_n$, where $$N_u(r,\theta) = \sum_{n=0}^{N} \beta_n(r,\theta) \int_0^{2\pi}\int_0^{r_\omega} \delta(r,\theta)\beta_n(r,\theta) r\, dr\, d\theta$$

wherein $\beta_n(r,\theta)$ are said basis functions corresponding to the first distribution profile, $\delta(r,\theta)$ is a deposition profile of said parameter under investigation, and r and $\theta$ are parameters of the substrate physical domain $\omega(r,\theta)$, (d) a fourth unit formulating a uniformity optimization criterion $S(r,\theta)=\delta(r,\theta)-N_u(r,\theta)$ defined as a deviation of the deposition profile $\delta(r,\theta)$ of the parameter from the NUPP $N_u(r,\theta)$ at a predetermined region of the thin film; and (e) a fifth unit creating the uniformity optimization strategy for adjusting the thin film processing system to minimize the uniformity optimization criterion.

These and other features and advantages of the present invention will be clear from further description of the preferred embodiment in conjunction with the Drawings.

BRIEF DESCRIPTION OF THE DRAWINGS

FIGS. 1A-1C are schematic representations of cross-sectional views of three CVD conventional reactor designs, all featuring wafer rotation: cross flow (duct) single wafer reactor (FIG. 1A), single wafer cylindrical reactor (FIG. 1B), multiple wafer radial flow planetary reactor system (FIG. 1C);

FIGS. 9A-9C are representations of reactor/wafer quadrature grid geometry over the deposition and wafer domains for cross flow, cylindrical and planetary reactors, respectively;

FIGS. 11A and 11B are representations of an example of $p^o$ (FIG. 11A) and $\hat{p}$ (FIG. 11B);

FIG. 12 is a representation of the $\beta_n$ modes;

FIGS. 13A-13D illustrate the application of the proposed uniformity optimization technique to a planetary CVD reactor simulation. In FIG. 13A, a reactor concentration profile curves $X_A$, $X_B$ and $X_C$ correspond to an inlet gas velocity of 20 m/s. The resulting deposition profile over the wafer is shown in FIG. 13B, and the NUPP is shown in FIG. 13C. In FIG. 13D, the current deposition profile and NUPP profiles are superimposed with an arrow indicating the direction of gas flow;

FIGS. 16A-16B represents schematically two modes of operation of the reactor;

FIG. 19 is a schematic representation of a reactor susceptor design featuring a recess that contains "a monitoring strip" for determining the stalled wafer profile without sacrificing the wafer.

DETAILED DESCRIPTION OF THE PREFERRED EMBODIMENTS

A fundamental question of finding the deposition profiles which produce perfectly flat deposition profiles on the rotated wafers (substrates) is examined herein, and an approach is presented for identifying the subspace of all stalled wafer profiles that produce uniform films upon rotation. The basis for this subspace is used to identify the Nearest Uniformity Producing Profile (NUPP), a criterion shown to be useful for optimizing thin film uniformity in planetary reactor systems. The concept of this uniformity producing subspace is broadened herein to include a substantially unlimited spectrum of reactor geometries for the implementation of NUPP-based uniformity optimization techniques.

The unambiguous uniformity criterion "Nearest Uniformity Producing Profile" (NUPP) is developed which is the basis for formulating an optimization criterion defined as the minimization of the distance between the NUPP and the profile of the deposited thin film. The distance may be minimized as part of a process recipe development procedure in a run-to-run control system or as part of reactor geometry adjustment. Thus formulated optimization criterion depends only on the reactor and wafer dimensions, and thus may be universally applied to any distributed film quality to be controlled and to any reaction and material system. For example, this approach to uniformity control can be applied to film thickness and composition (e.g., dopant level) control, as well as to the control of other film characteristics. The optimization technique of the present invention is also applicable to other applications, such as, for example, ion-beam etching tools where planetary motion is used to compensate for beam divergence, as well as in optical coating processes where planetary deposition systems are used to reduce the effect of non-uniformities in the coating plume.

Uniformity Modes

Figure 1D:
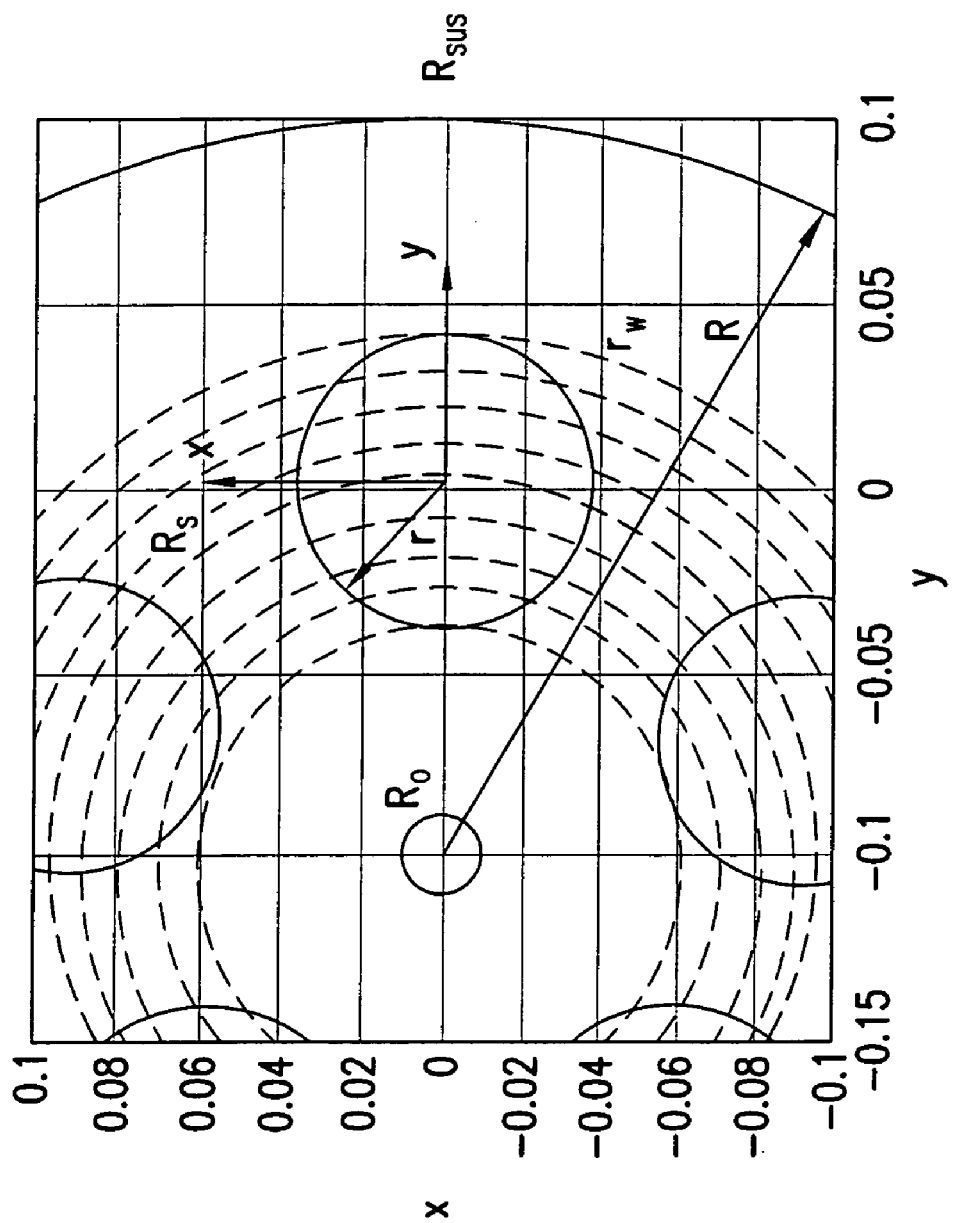
FIG. 1D is a representation of the physical domain of the susceptor and wafers in the multiple wafer radial flow planetary reactor system of FIG. 1C.

The development of the uniformity analysis approach is initiated by defining the physical domains of the reactor and wafer. Using the notation of FIG. 1D, the susceptor and wafer domains $\Omega$ and $\omega$, respectively, their respective coordinate systems consist of $\Omega: R_s - r_w \leq R \leq R_s + r_w$ and $\omega: 0 \leq r \leq r_w$, $0 \leq \theta \leq 2\pi$, or in Cartesian coordinates, $\omega: (x, y)$ such that $x^2 + y^2 \leq r_w^2$. $\Delta(R)$ is defined as the one dimensional deposition profile of a quality parameter of interest of the deposited thin film over the susceptor radial coordinate. The deposition profile $\Delta(R)$ is assumed independent of the azimuthal coordinate due to susceptor rotation. $\delta(x, y)$ or $\delta(r,\theta)$ is the two dimensional profile that results when $\Delta(R)$ is projected onto the stalled (non-rotating) wafer physical domain. Therefore, for $x=0$, the deposition profiles are related by $$\delta(0,y) = \Delta(y+R_s) \tag{Eq. 1}$$

The relationship between the coordinate systems is $$x^2 + (y+R_s)^2 = R^2 \tag{Eq. 2}$$

so that $$\delta(x,y) = \Delta(\sqrt{x^2 + (y+R_s)^2}) \tag{Eq. 3}$$

$$\delta(r,\theta) = \Delta(\sqrt{r^2\cos^2\theta + (r\sin\theta + R_s)^2}) \tag{Eq. 4}$$

Having defined the film profile $\delta(r, \theta)$ as corresponding to the stalled wafer deposition pattern, wafer rotation will eliminate the $\theta$ dependence by averaging the film quality over $\theta$ giving $$\bar{\delta}(r) = \frac{1}{2\pi}\int_0^{2\pi} \Delta\left(\sqrt{r^2\cos^2\theta + (r\sin\theta + R_s)^2}\right) d\theta \tag{Eq. 5}$$

It is physically reasonable to assume the deposition profiles $\Delta(R)$ are smooth, continuous, bounded functions. Therefore, any profile $\Delta(R)$ over the wafer segment domain $R \in \Omega$ can be represented by an expansion in terms of a complete basis function sequence in $L^2(\Omega)$. For example, if $P_m(R)$ are the shifted Legendre polynomials defined on $\Omega$, then $$\Delta(R) = \sum_{m=0}^{\infty} a_m P_m(R) \tag{Eq. 6}$$

with $P_0 = 1$. Therefore, $$\bar{\delta}(r) = \sum_{m=0}^{\infty} a_m \frac{1}{2\pi}\int_0^{2\pi} P_m\left(\sqrt{r^2\cos^2\theta + (r\sin\theta + R_s)^2}\right) d\theta = \sum_{m=0}^{\infty} a_m \alpha_m(r) \tag{Eq. 7}$$

in $\omega$.

Figure 2:
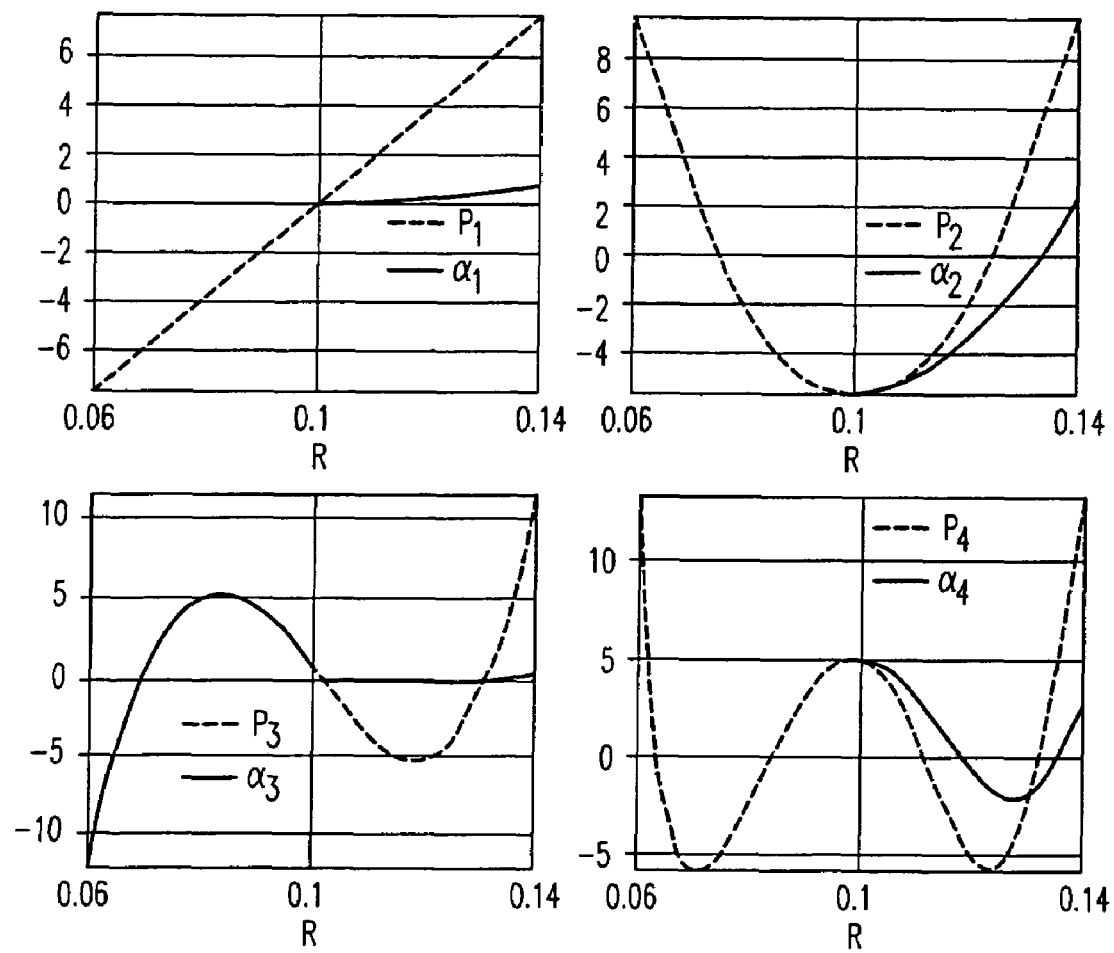
FIG. 2 are graphs representing the $P_m$, m=1, 2, 3, 4 and the corresponding $\alpha_m$ for the reactor geometry shown in FIGS. 1C-1D.

Since $P_0$ is constant with respect to R, $\alpha_0$ will likewise be constant. Therefore, this first mode corresponds to the most obvious deposition profile that would produce uniform films on the rotated wafers: If $\alpha_m = 0$ for $m=1, 2, \ldots$ and $\alpha_0 \neq 0$, then $\bar{\delta}(r)$ is flat because $\Delta$ is likewise flat. Therefore, $P_0$, and the corresponding $\alpha_0$, are removed from the analysis since the goal is to find non-uniform $\Delta(R)$ profiles that produce uniform $\bar{\delta}(r)$ profiles under rotation. The $P_m$, $m=1, 2, 3, 4$ and the corresponding $\alpha_m$ are shown in FIG. 2 for the reactor geometry shown in FIG. 1.

Having eliminated the purely uniform mode from the problem formulation, the goal stated above may be written in terms of the minimization problem $$\min_{a_m}\left\|\sum_{m=1}^{M} a_m \alpha_m(r) - c\right\| \tag{Eq. 8}$$

where c is a constant with respect to r and $c \geq 0$; M is a truncation number set sufficiently large to capture the smallest anticipated feature size to be controlled in the film. For the cases $c > 0$, the mode amplitude coefficients am can be scaled by c, and it is legitimate to set $c=1$ in (Eq. 8) without loss of generality.

Defining the array Q of inner products over $\omega$, $$Q_{ij} = \langle \alpha_i \alpha_j \rangle \, i=1, \ldots, M \quad \text{(Eq. 9)}$$

$$\text{then } Q = U\Sigma V^T \quad \text{(Eq. 10)}$$

where the Singular Value Decomposition (SVD) produces $U^{M \times M}$ containing the orthogonal singular vectors and $\Sigma$ the singular values. From these products of the SVD, an orthogonal set of basis functions $\{\alpha_n^\upsilon\}_{n=1}^N$ is defined using $$\alpha_n^\upsilon = \sum_{m=1}^{M} U_{m,n} \alpha_m(r) \quad \text{(Eq. 11)}$$

for the space spanned by the $\{\alpha_n\}_{m=1}^M$.

Figure 3:
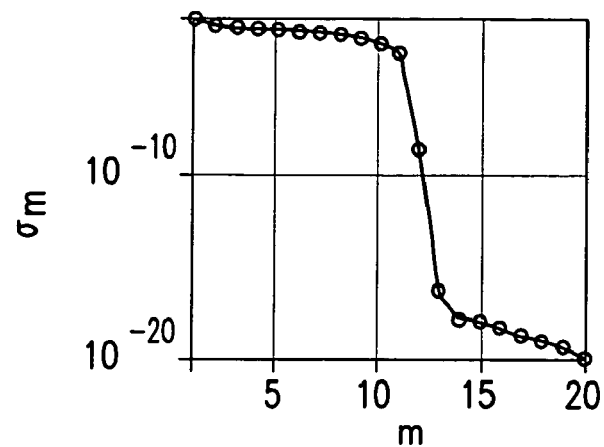
FIG. 3 is a graphical representation of singular values of $\sigma_m$ generated when computing the span of the rotationally averaged shifted Legendre polynomials.

Typically, the singular values of Q used to define the $\alpha_n^\upsilon$ appear as those shown in FIG. 3. The set of relatively small magnitude $\sigma_m$ indicate that there are fewer than M $\alpha_n^\upsilon$ necessary to span the space of the sequence $\{\alpha_m\}_{m=1}^M$. The breakpoint separating significant from relatively small singular values depends on the value of M and is difficult to define rigorously; therefore, Eq. 8 is solved by computing $$\in_N \, = \min_{a_j^\upsilon} \left\| \sum_{j=1}^{N} a_j^\upsilon \alpha_j^\upsilon - 1 \right\| \quad \text{(Eq. 12)}$$

for all $N \leq M$ and by choosing N such that $\in_N$ is minimized (since the $\alpha_j^\upsilon$ are orthonormal, the $a_j^\upsilon$ are found by projecting the constant function 1 onto the $\alpha_j^\upsilon$). That the optimal value of N generally is less than M because for small values of N the expansion in $\alpha_j^\upsilon$ produces a poor approximation of 1 because of an insufficient number of basis functions, while a value of N approaching M will result in the expansion including the $\alpha_j^\upsilon$ that correspond to a vanishingly small $\sigma_j$, reducing the accuracy of the projection operation. This calculation leads to the definition of the first non-flat deposition mode that generates uniform films when rotated:

$$\beta_1(R) = \sum_{m=1}^{M} b_m P_m(R) \quad \text{(Eq. 13)}$$

where $\beta_0$=constant and $$b_m = \sum_{n=1}^{N} U_{m,n} a_n^\upsilon \quad \text{(Eq. 14)}$$

Figure 4:
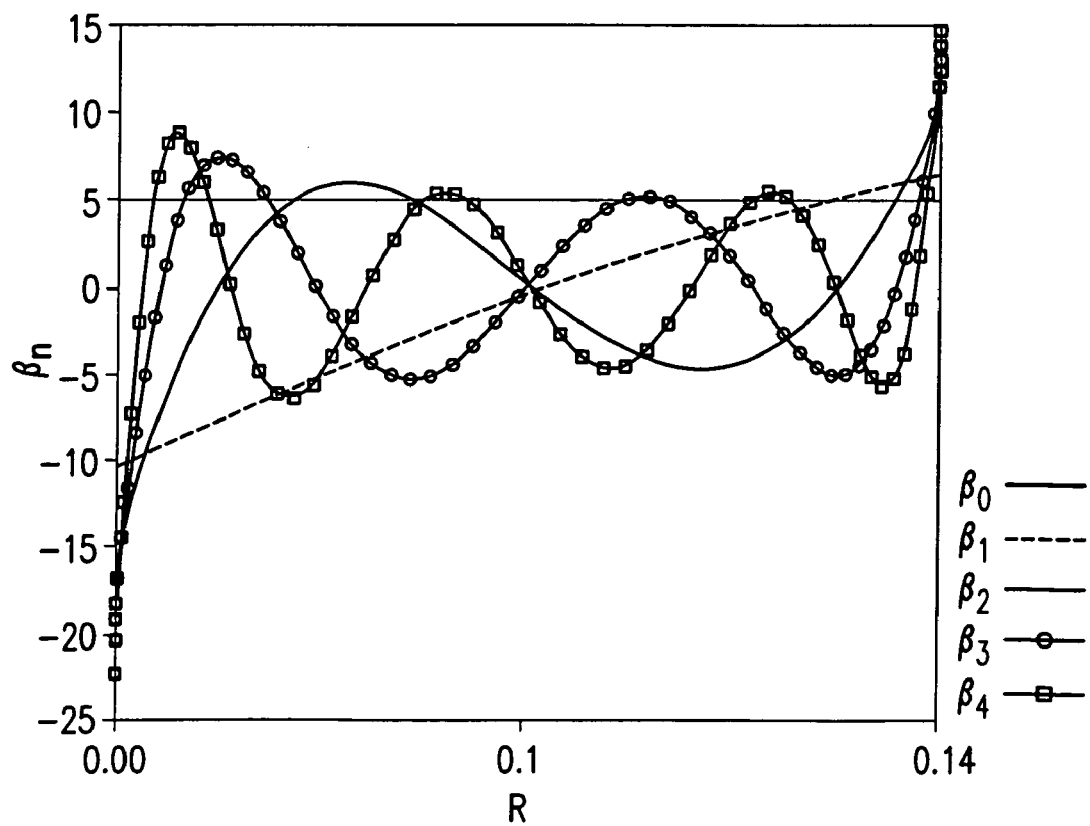
FIG. 4 is a graph representing a plurality of $\beta_n$ functions.

The procedure described above produces a single $\beta_n$ profile. Sequentially removing the lower-frequency $\alpha_j^\upsilon$ from the problem of finding the $\alpha_j^\upsilon$ that minimizes $\in_N$ forces the minimization procedure to find a progression of modes correspondingly increasing in frequency. Therefore, additional $\beta_n$ modes may be produced by minimizing the sequence of problems $$\in_N \, = \min_{a_j^\upsilon} \left\| \sum_{j=n}^{N} a_j^\upsilon \alpha_j^\upsilon - 1 \right\|. \quad \text{(Eq. 15)}$$

for n=2, 3, . . . to obtain the corresponding $\beta_n$. These modes, corresponding to the reactor geometry shown in FIGS. 1C-1D after orthonormalization, are seen in FIG. 4. The computations are carried out using the quadrature grid based weighted residual method techniques presented in Adomaitis R. A., "Objects for MWR" Computers & Chemical Engineering, 2002, 26 (7-8), pp. 981-998.

Figure 5:
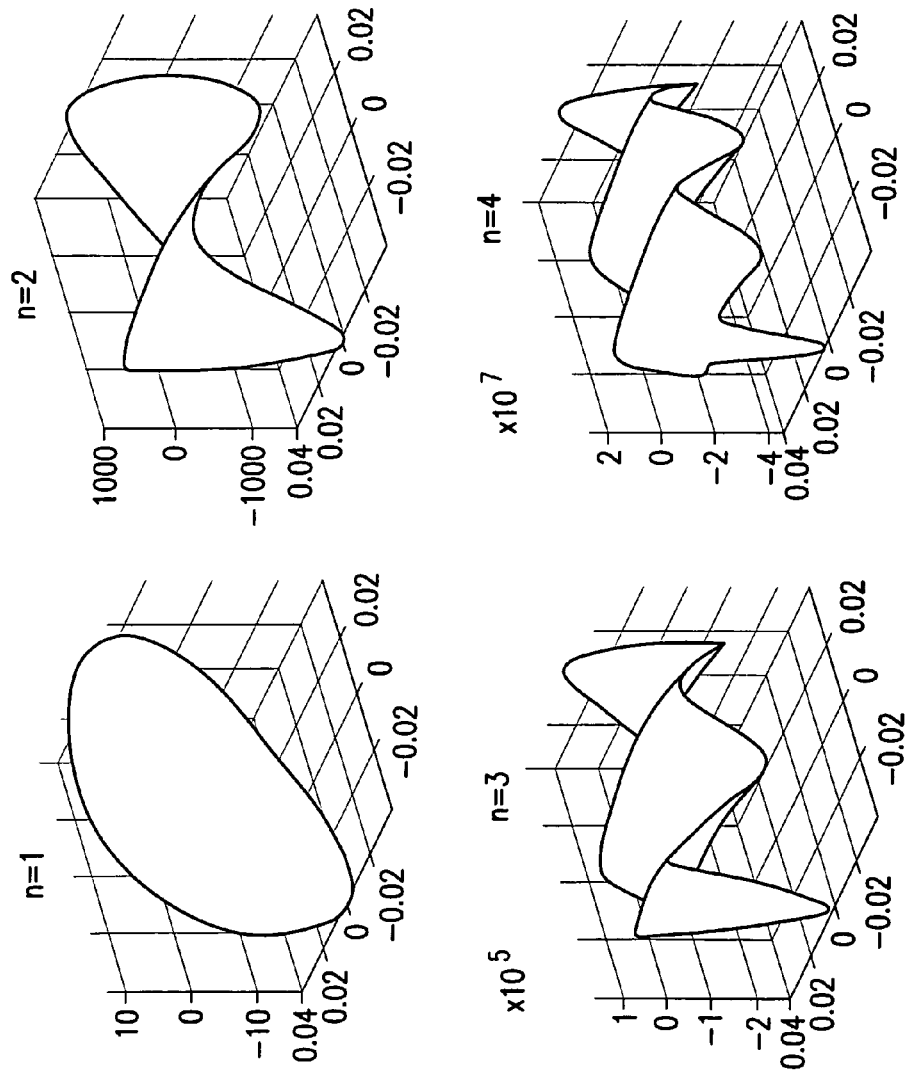
FIG. 5 is a diagram representative of the first four $\beta_n$ modes projected onto a stalled wafer.

Projecting the $\beta_n$ onto the stalled wafer domain $\omega$, the first four non-flat deposition profiles that produce uniform profiles when rotated are observed, as shown in FIG. 5. Because these modes define at least part of the basis for the uniformity producing subspace of all possible deposition profiles, any linear combination of the $\beta_n$ modes produces a uniform deposition profile under rotation. These modes $\beta_n$ depend only on the wafer and susceptor geometry, and therefore are universal in nature. The numerical techniques presented in this application accurately capture between several and tens of these modes before numerical difficulties in accurately minimizing (Eq. 15) are encountered.

Deposition Profile Model

To illustrate the utility of the $\beta_n$ modes in a CVD process optimization application, a representative gas-phase thermal decomposition of a deposition precursor species A through a sequence of irreversible reactions (B→C) is considered:

$$A \to B \to C$$

with the deposition rate $k_d$ being a function of gas phase mole fraction of Species C:

$$\Delta(R) = k_d x_C \quad \text{(Eq. 16)}$$

The deposition rate $k_d$ is a constant set to $k_d$=1 film thickness units/time. Typically, the precursor is fed to the reactor system near room temperature and at a low concentration level in a carrier gas that plays little or no role in the gas phase or deposition reaction. Therefore, a material balance for each of the three reactive gas phase species under the assumption of the ideal gas law can be written as $$\frac{1}{R}\frac{d}{dR}\left(\frac{1}{T} R \upsilon x_A\right) = -\frac{1}{T} k_1(T) x_A \quad \text{(Eq. 17)}$$

$$\frac{1}{R}\frac{d}{dR}\left(\frac{1}{T} R \upsilon x_B\right) = -\frac{1}{T} k_2(T) x_B + \frac{1}{T} k_1(T) x_A \quad \text{(Eq. 18)}$$

$$\frac{1}{R}\frac{d}{dR}\left(\frac{1}{T} R \upsilon x_C\right) = -\frac{1}{T} k_3(T) x_C + k_d x_C \quad \text{(Eq. 19)}$$

over $\Omega$, subject to initial conditions $x_i(R=R_0)=x_{i0}$. The continuity equation for the total gas molar flow rate gives $$\frac{d}{dR}(\upsilon p R) = 0 \text{ or } \upsilon = \frac{\upsilon_0 R_0 T}{T_0 R} \quad \text{(Eq. 20)}$$

and this result is used to simplify the species balance equations.

Finally, assuming the heat capacity and the gas/susceptor heat transfer coefficient are independent of temperature, the gas phase thermal energy balance gives $$\frac{1}{R}\frac{d}{dR}(vR) = h(T_s - T) \qquad \text{(Eq. 21)}$$

for the case where the susceptor is at a constant temperature $T_s$ and the reactor roof is perfectly insulating.

For this system, the concentration profiles are computed for $R_0 \leq R \leq R_{sus}$ with $R_0 = 0.01$ m corresponding to the mixing region surrounding the central feed tube, susceptor diameter $R_p = 0.2$ m, satellite wafer centerline radius $R_s = 0.1$ m, and wafer radius $r_\omega = 0.04$ m. Spacing between the susceptor (wafer top) surface and the reactor roof is set at 0.02 m, and the initial value of $v_0 = 20$ m/s.

Figure 6A:
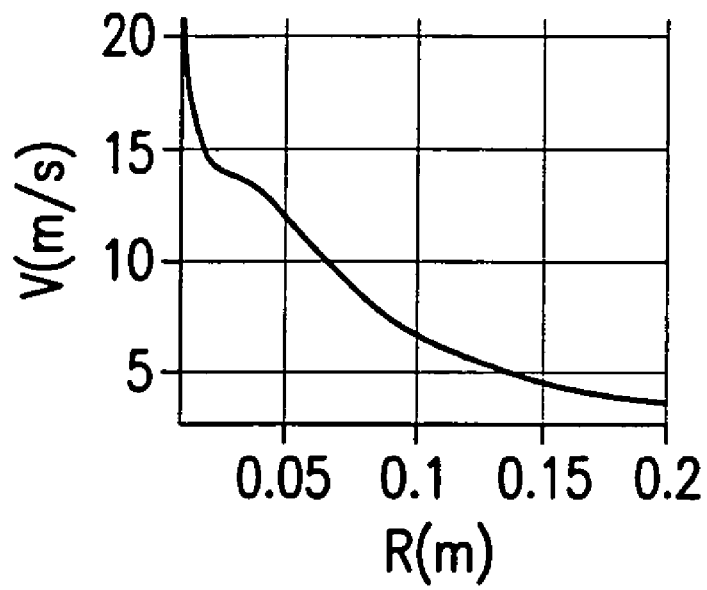
FIGS. 6A-6C are graphs representing gas velocity, temperature and composition profiles, respectively. The wafers are located in the region of FIG. 6C between $0.06\ m \leq R \leq 0.14\ m$.
Figure 6B:
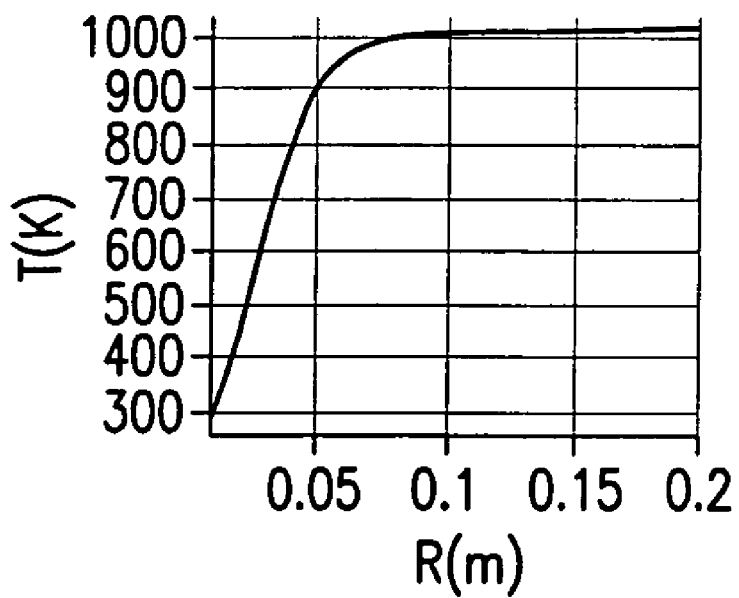
Figure 6C:
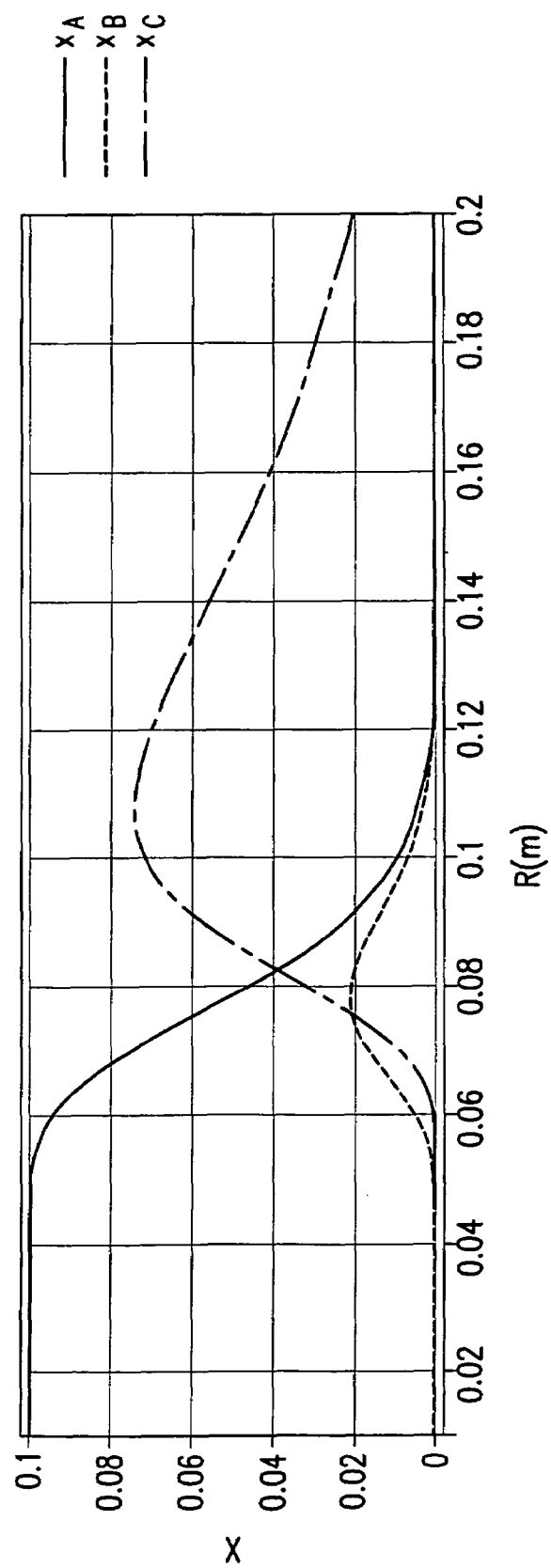

Typical results are shown in FIGS. 6A-6C where the axial mean of the gas radial velocity, gas temperature, and the concentration profiles of each chemical species are plotted as a function of R. In these simulation results, the rapid decrease in gas radial velocity is observed due to the radial flow geometry, the rapid gas heating inside the reactor, and the decomposition of species A to B followed by the quick decomposition of the deposition species C. The peak concentration of species C is observed near the wafer centerline.

In the analysis presented in the following paragraphs it is shown that this species concentration profile results in a highly non-uniform radial profile when the wafer is rotated. Using an optimization technique based on the $\beta_n$, the change in operating conditions is determined which is necessary to improve the deposition uniformity.

Optimization Criterion Formulation

Figure 7:
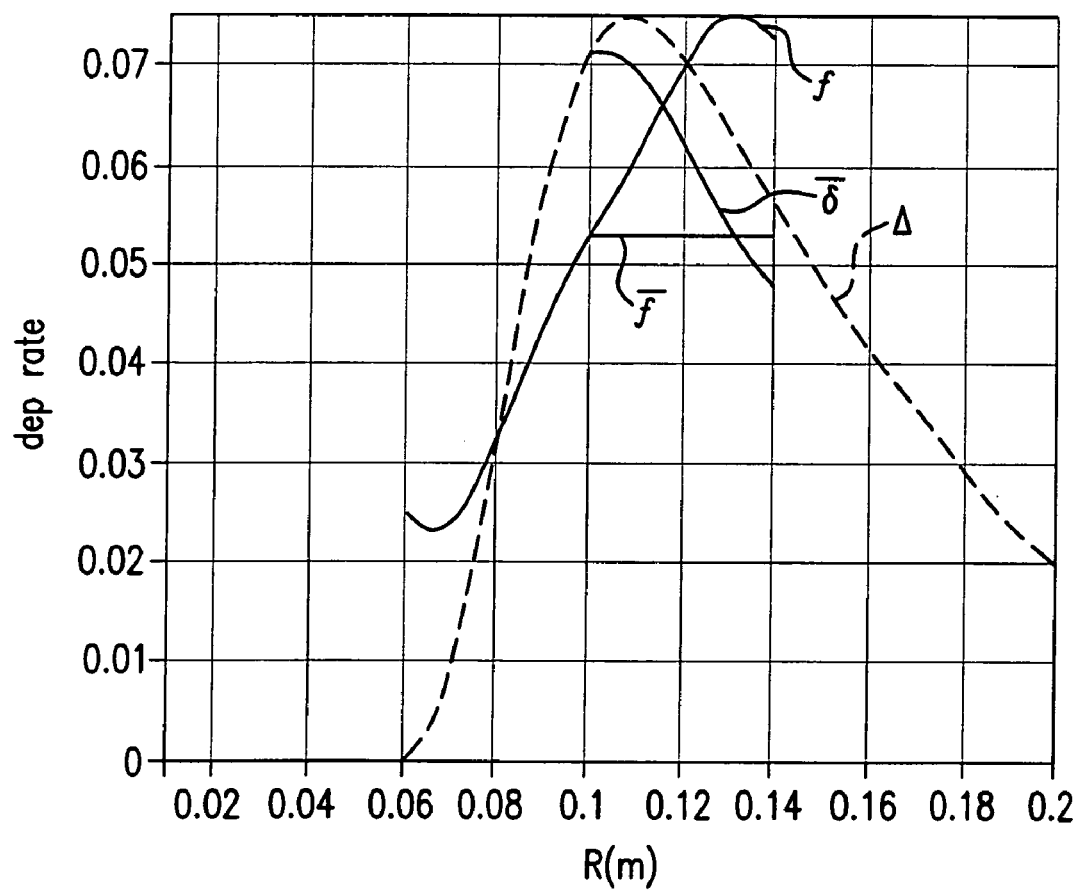
FIG. 7 is a diagram representing wafer deposition profile $\delta$, equivalent to $\Delta$ between $0.06\ m \leq R \leq 0.14\ m$, the resulting profile upon rotation data $\bar{\delta}$, the nearest uniformity generating profile (NUPP) $f$ and NUPP profile upon rotation $\bar{f}$. $C_d$ is computed as a difference between $\delta$ and $f$ at R=0 (R=0.1 m)

For the planetary reactor deposition system simulation under consideration, the "nearest" deposition rate profile $f$ that generates a uniform film upon rotation $\bar{f}$ is shown in FIG. 7. This optimal profile $f$, henceforth referred to as the "Nearest Uniformity Producing Profile" (NUPP), is computed as the projection of the deposition profile $\Delta(R)$ onto the $\beta_n$:

$$f = \sum_{n=1}^{N} (\Delta(R), \beta_n)\beta_n \qquad \text{(Eq. 22)}$$

where the inner product is defined on $\Omega$.

In this example, the NUPP and $\Delta$ are, for the most part, increasing functions with R for $R \in \Omega$, and both curves have a peak value within $\Omega$. The distance $C_d$ between the wafer centerline values of $\Delta$ and $f$ is positive and has a value that is a significant fraction of the mean film thickness itself.

$$C_d = \Delta - f \qquad \text{(Eq. 23)}$$

Based on the subject computation, physical intuition suggests increasing the inlet gas velocity to "push" the deposition peak towards the reactor outlet (to the right of the diagram presented in FIG. 7).

Figure 8A:
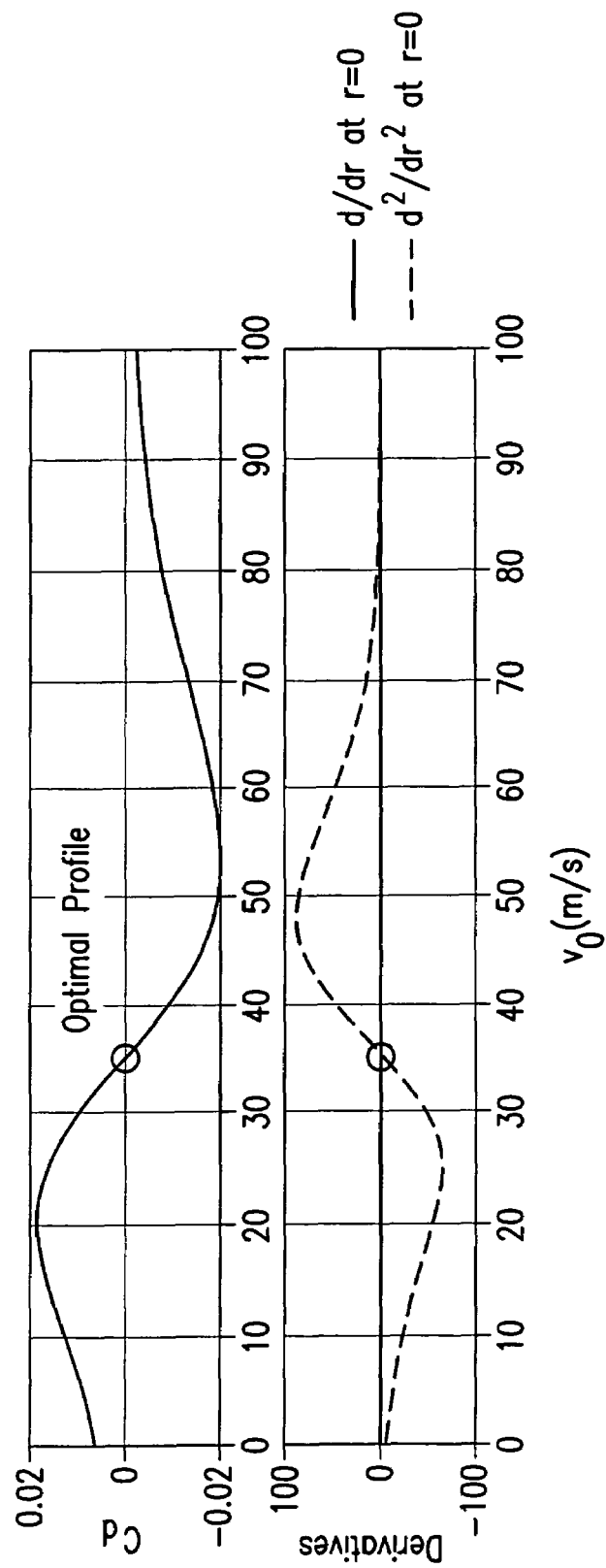
FIG. 8A is a diagram showing the $C_d$ and derivatives of $\delta$ versus inlet gas velocity.
Figure 8C:
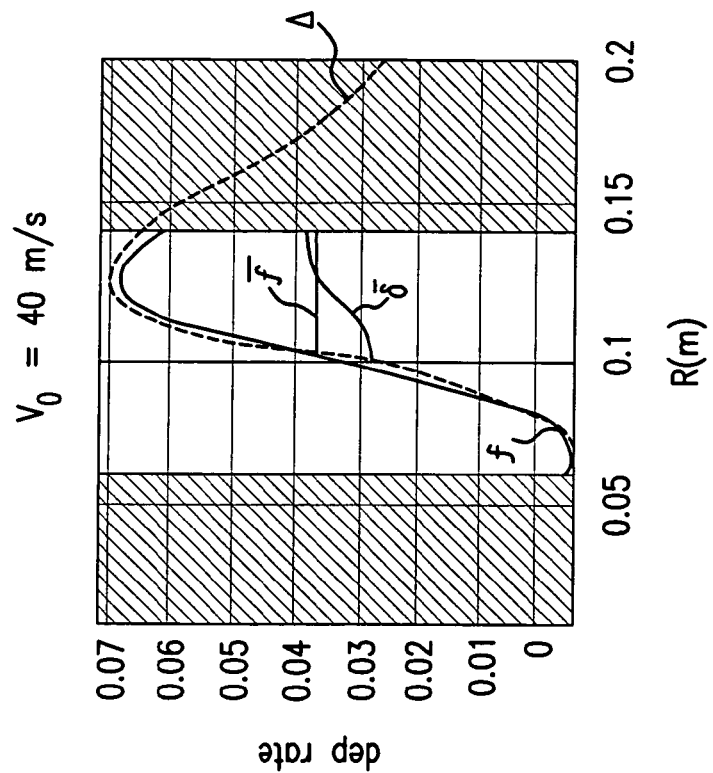
FIGS. 8B and 8C are the diagrams of deposition profile $\delta$, equivalent to $\Delta$ between $0.06\ m \leq R \leq 0.14\ m$, the resulting profile upon rotation $\bar{\delta}$, NUPP $f$ and NUPP profile upon rotation $\bar{f}$ at $v_0=30$ m/s and $v_0=40$ m/s, respectively.
Figure 8B:
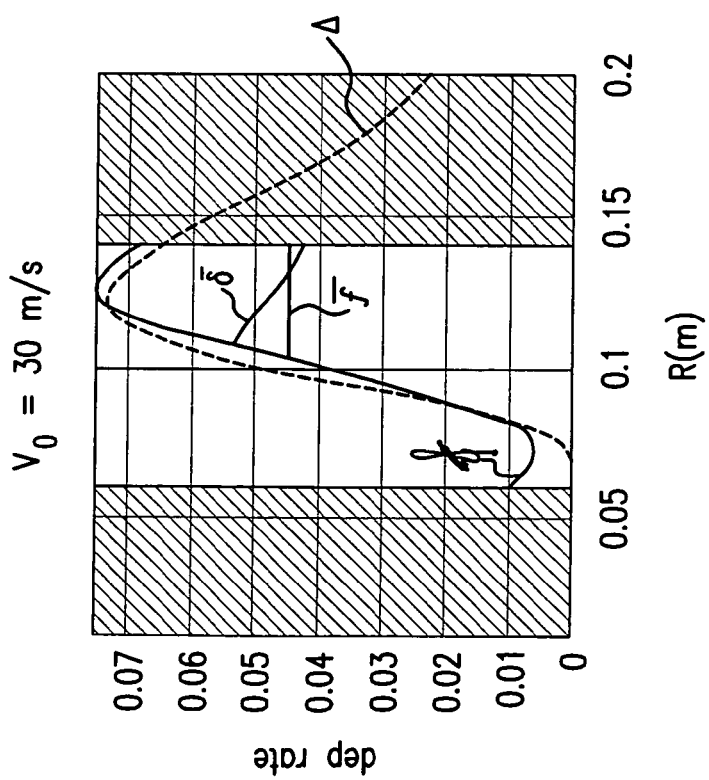

Motivated by this physical insight into a potential route to improving thickness uniformity, solutions are computed for a range of $v_0$ and the results are presented in FIG. 8a, illustrating a plot of $C_d$ vs. $v_0$. Additionally, the solutions and their NUPPs are presented in FIGS. 8b and 8c for two additional representative values of $v_0 = 30$ m/s and $v_0 = 40$ m/s, respectively. An important observation thus may be made from this sequence of simulations: when $f$ and $\Delta$ intersect at the wafer center $R = R_s$ ($R_s = 0.1$ in this diagram), $C_d = 0$ and the uniformity in the center region of the wafer is produced. Of course, wafer rotation and the assumption that deposition profiles are in $L^2(\Omega)$ guarantees $d\bar{\delta}/dr = 0$ at $r = 0$ regardless of the operating conditions. However, all derivatives of the rotated NUPP are zero and so the effect of the intersection of the deposition curve and the NUPP is to drive the second derivative of $\bar{\delta}$ with respect to r to zero, resulting in a very flat wafer profile in the neighborhood of the wafer center. It is clear from FIG. 8a that $d^2\bar{\delta}/dr^2 > 0$ when $C_d < 0$ and $d^2\bar{\delta}/dr^2 < 0$ when $C_d > 0$ for this system.

These observations lead to an unambiguous design criterion of $C_d = 0$ for improved wafer uniformity in the central region of the wafer, which is in many cases, the region where uniformity is most desired. In the case of simulation based process optimization, operating conditions satisfying this condition are easily determined simultaneously with the simulator solution using a Newton-Raphson technique. For this example, it was found that the optimal inlet velocity $v_0 = 35.04$ m/s, e.g., the point marked in FIG. 8a.

It is important to note that the $C_d = 0$ condition is not simply equivalent to determining the operating conditions where $d^2\bar{\delta}/dr^2 = 0$ at the wafer center. In practice it is difficult to obtain accurate values of derivatives of wafer measurements because of noise and other sources of error. The wafer metrology data is projected onto a relatively small number (e.g., four in this case) of the least oscillatory $\beta_n$ modes and the projection operation has a natural noise-filtering effect which improves the accuracy with which the criterion is evaluated.

Furthermore, in addition to the potential physical insight into process optimization revealed in this analysis approach, the relative slope of the intersecting $\Delta$ and $f$ curves at $r = 0$ when $C_d = 0$ may determine how quickly the films become non-uniform in the direction away from the wafer center. Likewise, the overall slope of the intersecting $\Delta$ and $f$ curves may determine how robust the film uniformity is to model errors and process unknowns.

In the above paragraphs, a new approach to film uniformity control is presented for planetary CVD systems. The approach to determining the "nearest" optimal profile has potential in interpreting measurements from stalled wafer experiments to provide guidance on process condition modifications that would lead to improved uniformity. Experimental work has been conducted to implement these concepts to improve the performance of a commercial CVD reactor system using a run-to-run control criterion based on driving $C_d$ to zero. To implement this uniformity optimization approach to a run-to-run control framework, the reactor is run with a single stalled wafer that is sacrificed to make the measurements necessary to tune the tool to the desired operating point and to maintain its performance against drift and other disturbances.

Determining the NUPP function $f$ is shown to lead to real physical insight on how reactor operating conditions should be adjusted to improve uniformity. Additionally, NUPP functions with segments that are physically infeasible (such as negative deposition rate profiles) may indicate that the reactor system is operating "far" from a feasible uniformity profile.

The uniformity control criterion $C_d$ is a step towards a new, abstract and universal equipment design approach, where CVD systems may be designed to maximize the likelihood of producing films in this uniformity subspace: since (n−1)-dimensional surfaces may be found where $C_d = 0$ in a n-dimensional design parameter space, it is possible to separate the design variables into a distinct subset to be used to optimize other processing criteria and to use the remainder to satisfy the $C_d$ minimization criterion.

Furthermore, it is possible, using the approach of the present invention to generate reactor designs that minimize the sensitivity of satisfying this criterion to design model by choosing design points on the $C_d$=0 surface where satisfaction of this criterion is least sensitive to the most uncertain elements of the process model used for reactor design. The broadening of the applicability of the NUPP criterion from the planetary reactor system, shown in FIGS. 1C-1D, to a wider range of systems, and examination in more detail of the structure of the uniformity-producing subspace, its implications in developing uniformity control techniques, and improved process characteristics and reactor designs are presented in the following paragraphs.

Figure 9A:
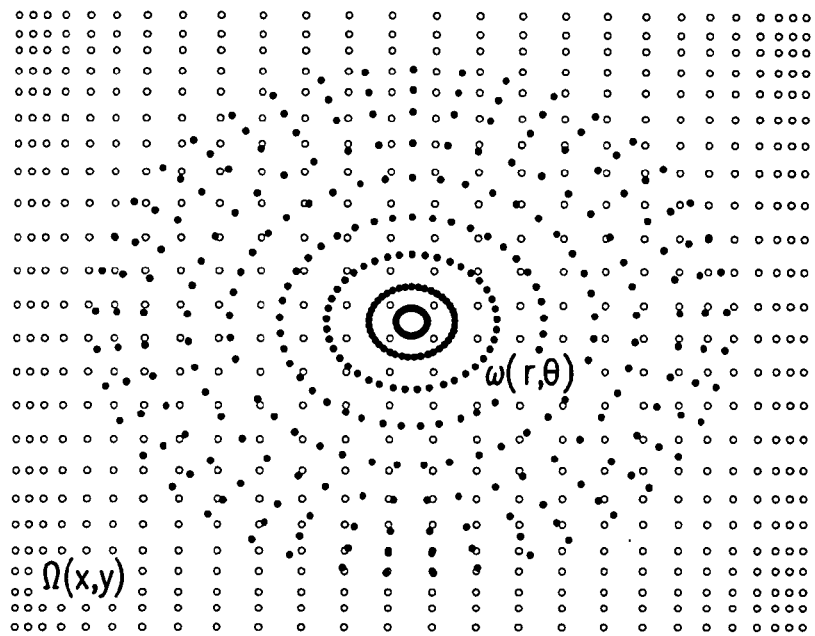
Figure 9B:
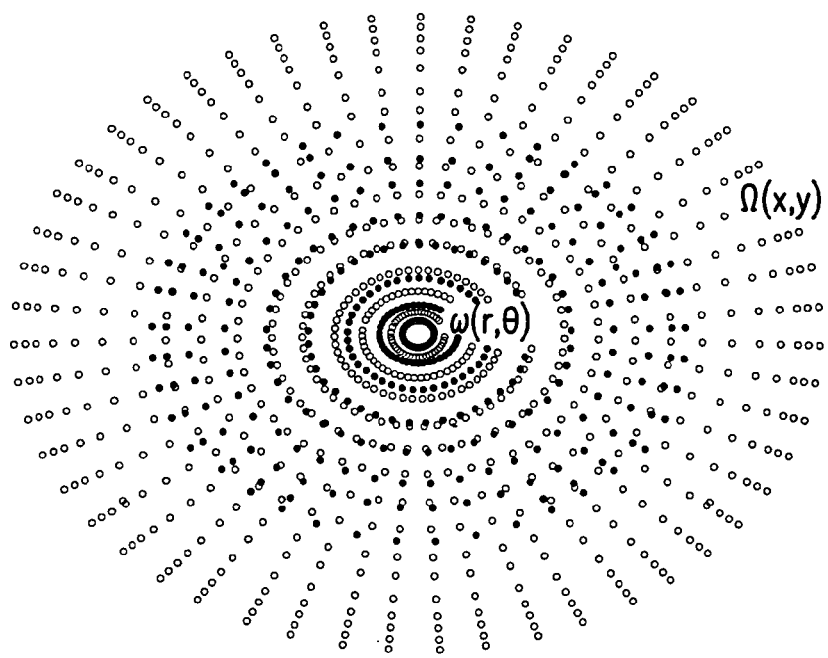

For any reactor configuration, reactor $\Omega(x,y)$ and wafer $\omega(r,\theta)$ physical domains are defined, as shown in FIGS. 9A-9C showing cross-flow, cylindrical and planetary reactor geometries, respectively. Film growth takes place in reactor physical domain $\Omega$. A property $\Delta(x, y)$ under investigation which is desired to be spatially uniform is defined in at least a portion of this domain $\Omega$. Given the complete basis function sequences $\{\phi_i(x)\}i^\infty=1$ and $\{\psi_j(y)\}j^\infty=1$ (such as sequencing of polynomial functions, or Fourier function sequencing), this film property is represented by $$\Delta(x, y) = \sum_{i,j=1}^{\infty} a_{i,j}\phi_i(x)\psi_j(y) = \sum_{i,j=1}^{I,J} a_{i,j}\phi_i(x)\psi_j(y) \quad \text{(Eq. 24)}$$

where the finite truncation numbers I, J can be used because of diffusion and other physical phenomena that limit the maximum length scale that must be resolved by the basis function expansion, and wherein $a_{i,j}$ are coefficients representing contribution of each basis function $\phi_i(x)$ and $\psi_j(y)$ into $\Delta(x, y)$. Defining P as the operator that projects $\Delta$ onto $\omega$, $$\delta(r,\theta) = P\Delta(x,y) \quad \text{(Eq. 25)}$$

the stalled wafer deposition profiles $\delta(r,\theta)$ are found $$\delta(r, \theta) = \sum_{i,j=1}^{I,J} a_{i,j}P\phi_i(x)\psi_j(y) = \sum_{i,j=1}^{I,J} a_{i,j}p_{i,j}(r, \theta) \quad \text{(Eq. 26)}$$

Figure 10:
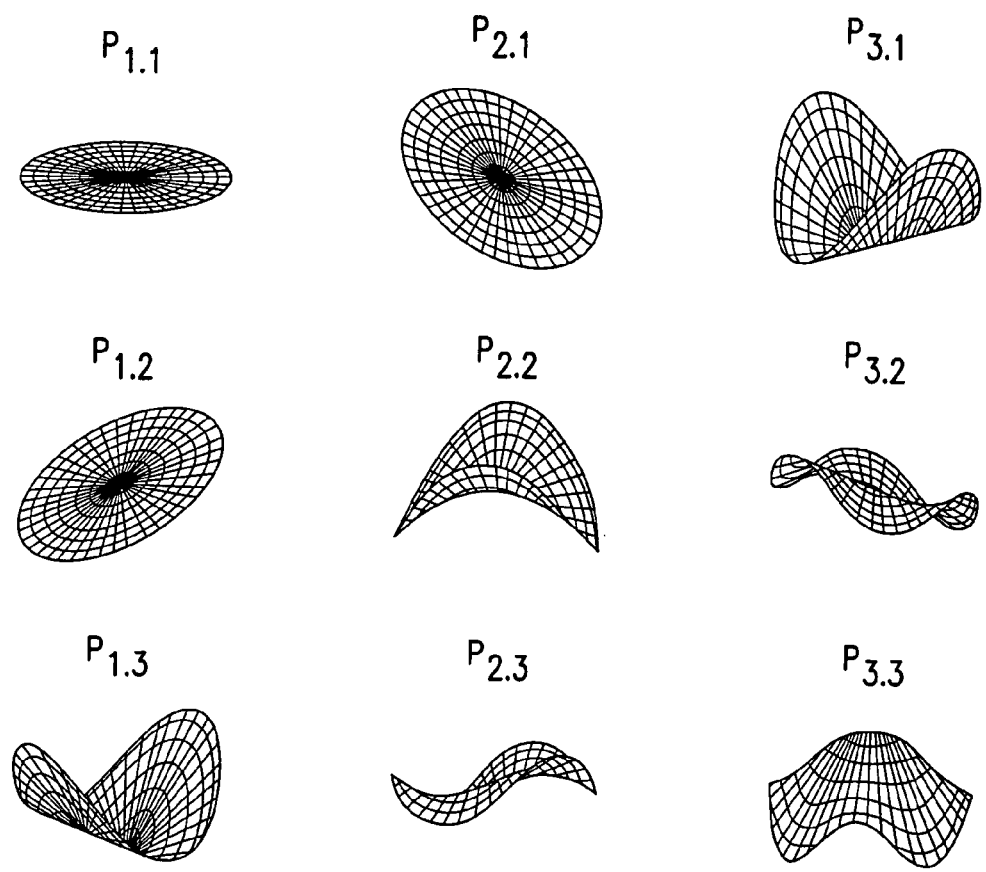
FIG. 10 represents a plurality of projections $p_{i,j}$ of a complete set of basis functions over the deposition domain of the wafer.
Figure 13A:
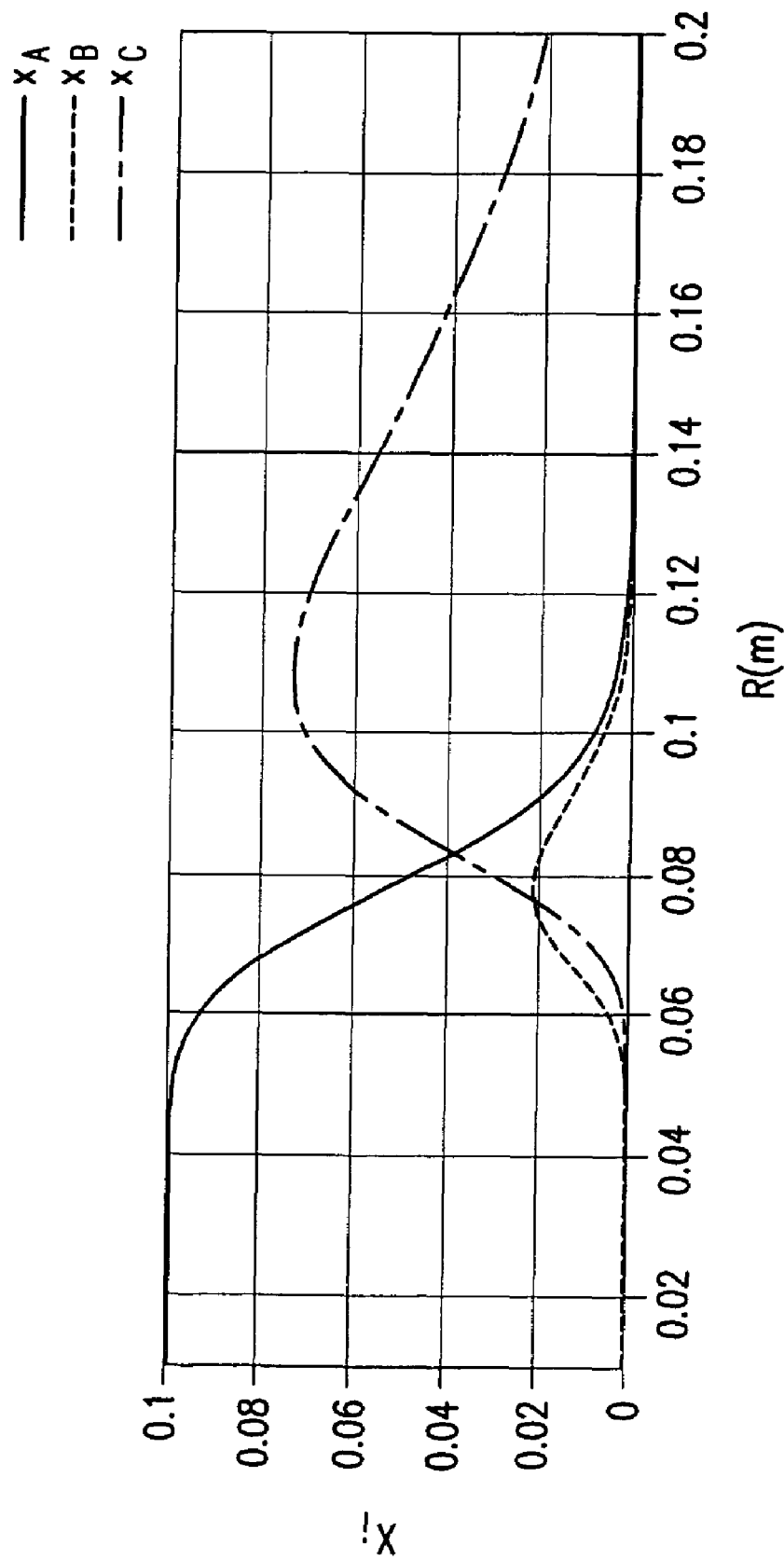
Figure 14A:
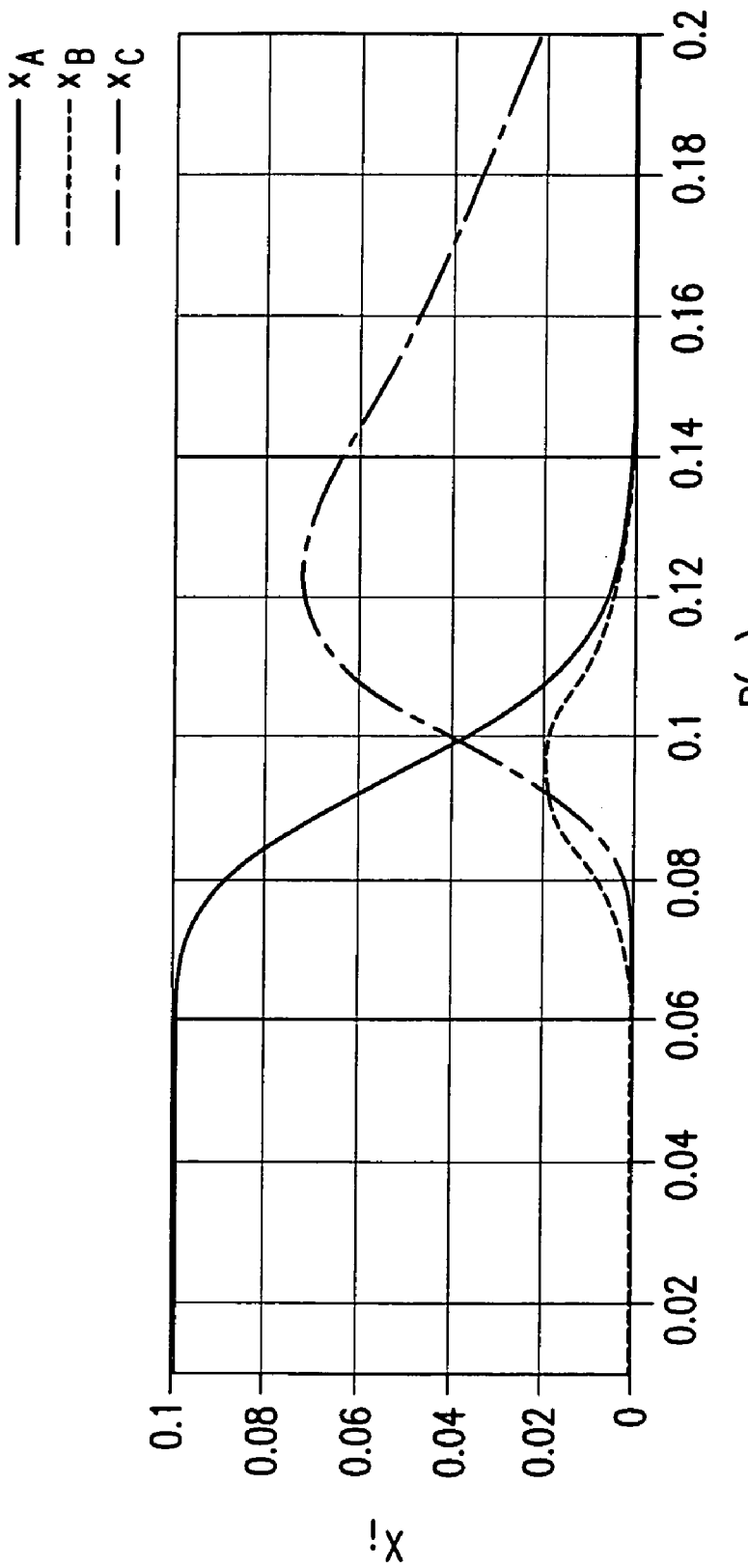
FIGS. 14A-14D illustrate a diagram representative of reactor concentration profile curves $X_A$, $X_B$, and $X_C$ corresponding to an optimized inlet gas velocity of 35.04 m/s. The resulting deposition profile over the wafer is shown in FIG. 14B, the NUPP is shown in FIG. 14C, and the current deposition profile and NUPP profiles are superimposed in FIG. 14D with an arrow indicating the direction of gas flow.
Figure 14C:
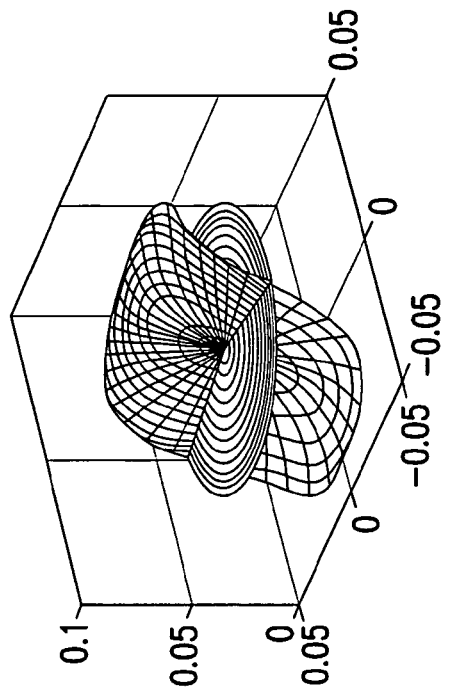
Figure 14D:
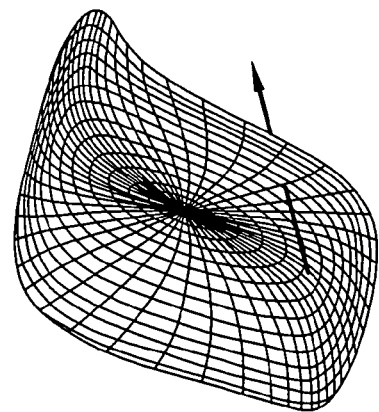
Figure 14B:
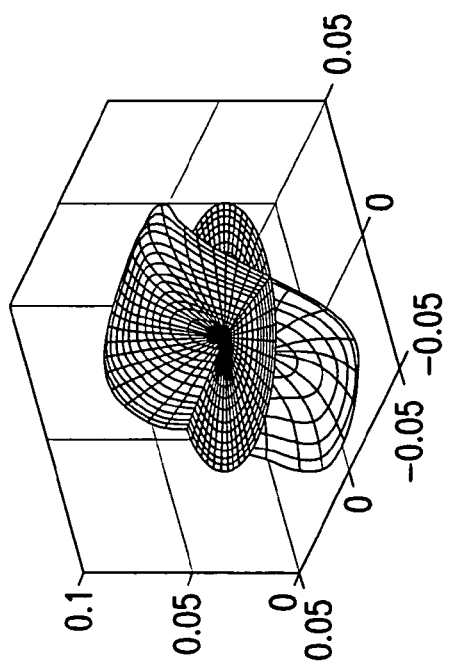

Representative $p_{i,j}$ which are the basis functions over the wafer $\omega$ which are used to represent the true profile $\delta(r,\theta)$ are shown in FIG. 10.

Further, defining R as the operator that determines the rotationally-averaged $\bar{\delta}$ profiles of the stalled wafer profiles $\delta$:

$$\bar{\delta}(r) = R\delta(r, \theta) \quad \text{(Eq. 27)}$$

$$= \sum_{i,j=1}^{I,J} a_{i,j}Rp_{i,j}(r, \theta)$$

$$= \sum_{i,j=1}^{I,J} a_{i,j}\alpha_{i,j}(r)$$

wherein $\alpha_{i,j}(r)$ are representations of $p_{i,j}(r,\theta)$ upon averaged rotation.

The next step is to classify the $p_{i,j}$ according to the produced $\alpha_{i,j}$:

For uniform $\alpha_{i,j}$. These include the set $\{p^0\}_{n=1}^{n_0}$ defined as all $p_{i,j}$ corresponding to trivial (zero value) $\alpha_{i,j}$; and the set $\{\bar{p}\}_{n=1}^{\bar{n}}$ defined as all $p_{i,j}$ corresponding to uniform and non-zero $\alpha_{i,j}$ (FIG. 11A). Even if trivial, these modes will be included as part of the uniformity producing subspace in the final stage as will be presented further in detail.

For non-uniform $\alpha_{i,j}$. The set $\{\hat{p}\}_{n=1}^n$ is defined as all $p_{i,j}$ corresponding to non-uniform and nonzero $\alpha_{i,j}$ shown in FIG. 11B. This is the subspace that contains all non-uniformity producing profiles and some uniformity producing profiles requiring further analysis to separate them. The rotationally averaged modes corresponding to $\hat{p}$ are $\hat{\alpha}$.

Uniformity Producing Profiles in Span $\{\hat{p}\}$

The sequence of functions $\alpha^V$ is defined as $$\alpha^V = \text{span}\{\hat{\alpha}\} \quad \text{(Eq. 28)}$$

The set of $\alpha^V$ is computed using the Singular Value Decomposition procedure. The Gram-Schmidt, or any other orthogonalization procedure is applied to remove redundant $\hat{\alpha}$. The process is written in matrix form $$[\alpha_n^V \Sigma] = \hat{\alpha}^T V$$

$$\alpha^V = V^t\hat{\alpha} \quad \text{(Eq. 29)}$$

where the $\alpha^V$ are the orthogonal basis functions $\alpha_n^V$ scaled by their corresponding singular value $\sigma_n$. The goal is to determine the subspace of span$\{\hat{\alpha}\}$ corresponding to perfectly uniform profiles under rotation. The search for a result may be computed using the following sequence of operations:

1. Determine the coefficients b by projecting the $\alpha_m^V$ onto a perfectly uniform rotationally averaged profile with numerical value 1:

$$\varepsilon = \min_b \left\| \sum_j b_j \alpha_j^V - 1 \right\| \quad \text{(Eq. 30)}$$

2. For $\varepsilon$ smaller than a tolerance given by physical grounds related to the specific uniformity control problem, using the computed b, the stalled wafer profiles that give uniform films under rotation are reconstructed using $$b^T\alpha^V = b^T V\alpha_{un} \quad \text{(Eq. 31)}$$

Replacing each $\alpha_m$ in the Eq. 31 with its corresponding $\hat{p}_m$ results in the uniformity producing mode $\hat{\beta}_0$:

$$\hat{\beta}_0 = b^T V^T \hat{p} \quad \text{(Eq. 32)}$$

3. For the null space of $V^T$, there may be a corresponding stalled non-uniform profile. Therefore:

$$0 = V_{null}^T \hat{\alpha} \text{ and } \beta_{null} = V_{null}^T \hat{p} \quad \text{(Eq. 33)}$$

4. All uniform producing modes are further combined $$1 \text{ U} p^0 \text{ U} \bar{p} \text{ U} \beta_0 \text{ U} \beta_{null} \quad \text{(Eq. 34)}$$

5. When producing modes that satisfy the error tolerance set for ∈ cannot be longer found, the combined space containing all β modes are orthogonalized and normalized to produce the basis $$\{\hat{\beta}_n\}_{n=0}^{N} \qquad (Eq.\ 35)$$

which defines the subspace span $\{\hat{\beta}\}$ corresponding to all non trivial stalled wafers profiles that produce perfectly uniform films under wafer rotation. Representative $\hat{\beta}_n$ modes are shown in FIG. 12.

Defining the Nearest Uniformity Producing Profile (NUPP)

Since all linear combinations of the final set of modes generate flat profiles, the $\hat{\beta}_n$ shown in FIG. 12, may be used to generate a useful basis onto which a deposition profile $\delta(r,\theta)$ can be projected to immediately determine whether the particular profile will generate uniform films under rotation and, if it does not, predict the shape of the "nearest" profile that does. Likewise, these modes $\hat{\beta}_n$ may be used as a part of an efficient means of optimizing the deposition process for uniformity. The NUPP, $N_u(r,\theta)$ is simply computed using the projection operation:

$$N_u(r,\theta) = \sum_{n=0}^{N} \hat{\beta}_n(r,\theta) \int_0^{2\pi} \int_0^{r_\omega} \delta(r,\theta) \hat{\beta}_n(r,\theta) r dr d\theta \qquad (Eq.\ 36)$$

A measure of distance between the current deposition profile $\delta(r,\theta)$ and its NUPP $N_u(r,\theta)$ can be minimized as part of a simulation-based process recipe development procedure or in a run-to-run control system.

It is important to recognize that this criterion depends only on the reactor and wafer dimensions, and thus can be universally applied to any distributed film quality to be controlled as well as any reaction and material system. In other words, the present approach to uniformity control can be applied to film thickness and composition (e.g., dopant level) control, as well as the control of other film characteristics. Furthermore, the use of the NUPP concept is also applicable in other systems, including ion-beam etching tools where planetary motion is used to compensate for beam divergence, or in optical coating processes where planetary deposition systems are used to reduce the effect of non-uniformities in the coating plume.

An important feature of the subject invention is the development of an unambiguous uniformity criterion that gives an optimization objective function defined in terms of the minimization of the distance between the "Nearest Uniformity Producing Profile" (NUPP) and the full-wafer measurement profile.

In the original formulation of the NUPP, the uniformity optimization criterion Cd was defined (Eq. 23) as the centerline distance between $\delta(r,\theta)$ and the NUPP $N_u(r,\theta)$, and it is this distance that is minimized as the uniformity optimization criterion.

Considering the NUPP relative to the film thickness profile shown in FIGS. 13A-13D, given that the goal is to have the NUPP and actual deposition profile meet at r=0, a physically reasonable first choice for process optimization is to increase the total gas flowrate, resulting in the deposition peak shifting to the right as the profile is forced further downstream of the gas inlet due to the increased rate of convection. In this example, the NUPP and Δ are, for the most part, increasing functions with R for R∈Ω, and both curves have a peak value within Ω. The distance between the wafer centerline values of Δ and $f$ is positive and has a value that is a significant fraction of the mean film thickness itself. This difference is denoted as $C_d$. What emerges from this computation that is of immediate value is that physical intuition suggests the increase of the inlet gas velocity to "push" the deposition peak towards the reactor outlet (to the right of the diagram).

Motivated by this physical insight into a potential route to improving thickness uniformity, the solutions are computed for a range of $v_o$ and an observation is made from this sequence of simulations: when $f$ and $\Delta$ intersect at the wafer center R=R$_s$, then $C_d$=0 and uniformity is provided in the center region of the wafer. Wafer rotation and the assumption that deposition profiles are in $L^2(\Omega)$ results in d$\bar{\delta}$/dr=0 at r=0 regardless of the operating conditions. However, all derivatives of the rotated NUPP are zero; and the effect of the intersection of the deposition curve and the NUPP is to drive the second derivative of $\bar{\delta}$ with respect to r to zero, resulting in a flat wafer profile in the neighborhood of the wafer center.

These observations have led to an unambiguous design criterion of $C_d$=0 for improved wafer uniformity in the central region of the wafer. In the case of simulation based process optimization, operating conditions satisfying this condition are determined simultaneously with the simulator solution using a Newton-Raphson technique. For this example, the optimal inlet velocity is found to be $v_o$=35.04 m/s. The stalled and rotated optimal profiles are presented in FIGS. 14A-14D and clearly illustrate the improvement in uniformity.

It is important to note that the $C_d$=0 condition is not simply equivalent to determining the operating conditions where $d^2\bar{\delta}/dr^2$=0 at the wafer center. In practice it is difficult to obtain accurate values of derivatives of wafer measurements because of noise and other sources of error. Since the wafer metrology data would be projected onto a relatively small number of the least oscillatory $\hat{\beta}_n$ modes, the projection operation has a natural noise-filtering effect, improving the accuracy with which the criterion can be evaluated. Furthermore, in addition to the potential physical insight into process optimization revealed in this analysis approach, the relative slope of the intersection $\Delta$ and $f$ curves at r=0 when $C_d$=0 may determine how quickly the films become non-uniform in the direction away from the wafer center. Likewise, the overall slope may determine how robust the film uniformity is to model errors and process unknowns.

An important issue to be addressed is whether optimization criteria better than $C_d$ can be found, both in terms of improving what is theoretically possible as well as what will work best in applications to operating reactor systems. For example, an alternate definition of the distance to the NUPP may be to define the residual of the projection of a film property profile $\delta(r,\theta)$ onto the $\hat{\beta}_n$ modes:

$$S(r,\theta) = \delta(r,\theta) - N_u(r,\theta) \qquad (Eq.\ 37)$$

and in this manner the distance to the NUPP can be computed using the weighted inner produce $$d = \langle S, S \rangle_\rho \qquad (Eq.\ 38)$$

where the weight function $\rho$ could be used to focus uniformity control on relevant regions of the wafer.

It is important to keep in mind that the NUPP is not a stationary target profile and changes with the operating parameters manipulated to achieve uniformity.

Figure 15:
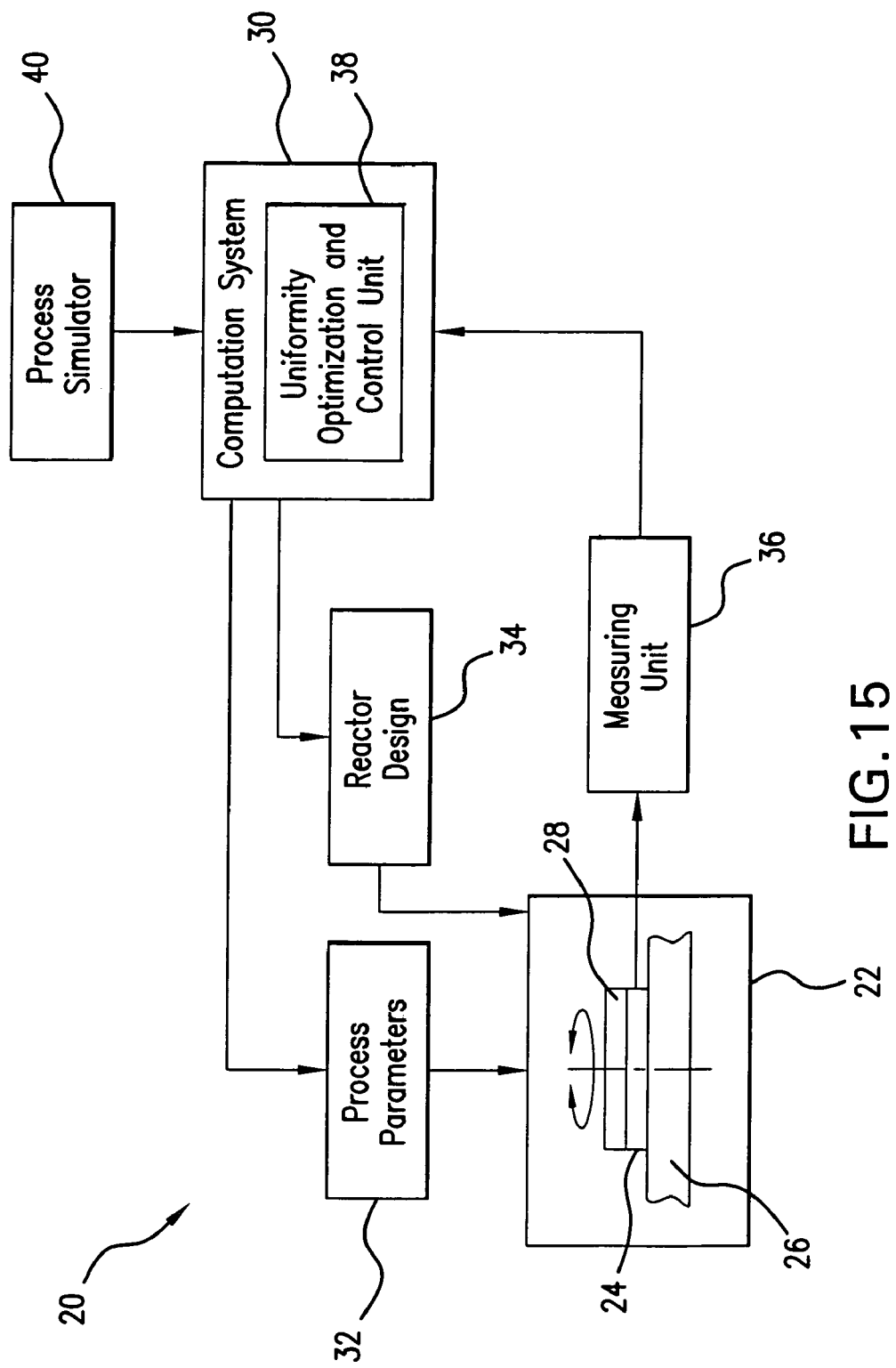
FIG. 15 is a simplified schematic of the processing system of the present invention for fabrication of highly uniform thin films.

Based on the analysis of the uniformity optimization and control presented in the previous paragraphs, a thin film processing system 20 is designed, which is schematically shown in FIG. 15. The system 20 includes a thin film processing chamber (or reactor) 22 which includes at least one, but usually a plurality of substrates (wafers) 24 which can be operated either in a stalled mode or in rotating mode as shown in FIGS. 16A-16B. The wafers 24 may be carried by a susceptor 26 which also may rotate about its axis as needed. Formation of a thin film 28 on the wafer 24 is performed by any type of deposition, e.g. CVD, PVD, ALD, etc. The deposition of the thin film 28 can be performed on a stalled wafer 24. As deposited, a thin film 28A (FIG. 16A) is characterized by a non-uniform profile of a film quality parameter (e.g. thickness, dopant level, morphology, electrical properties, etc.). In order to improve the uniformity of the thin film 28A the wafer 24 is rotated to obtain the thin film 28B having a better uniformity (FIG. 16B) of its quality parameters.

Referring back again to FIG. 15, the processing system 20 includes a computation system 30 operatively coupled to the reactor 22 bi-directionally to control process parameters 32, and/or optimize design parameters 34, as well as to receive measurements necessary for the optimization procedure. For this purpose, a measuring unit 36 is employed in the processing system 20 for measuring a quality parameter of the thin film 28 which needs to be optimized. The measuring unit 36 supplies the acquired data to the computation system 30 and particularly to the uniformity optimization and control unit 38 which is the core of the processing system 20 of the present invention.

A process simulator 40 is coupled to the computation system 30 which is used in an optimization subroutine of the uniformity control process of the present invention as will be described further in detail. The process simulator 40 is a series of complex mathematical algorithms designed to simulate a reactor and process conditions and permits tracking of every adjustment that is made in the system. The process simulator also estimates how long it takes in real time to obtain the required change. As the process simulators are known in the thin film fabrication industry their specifics are not discussed in detail herein.

Figure 17:
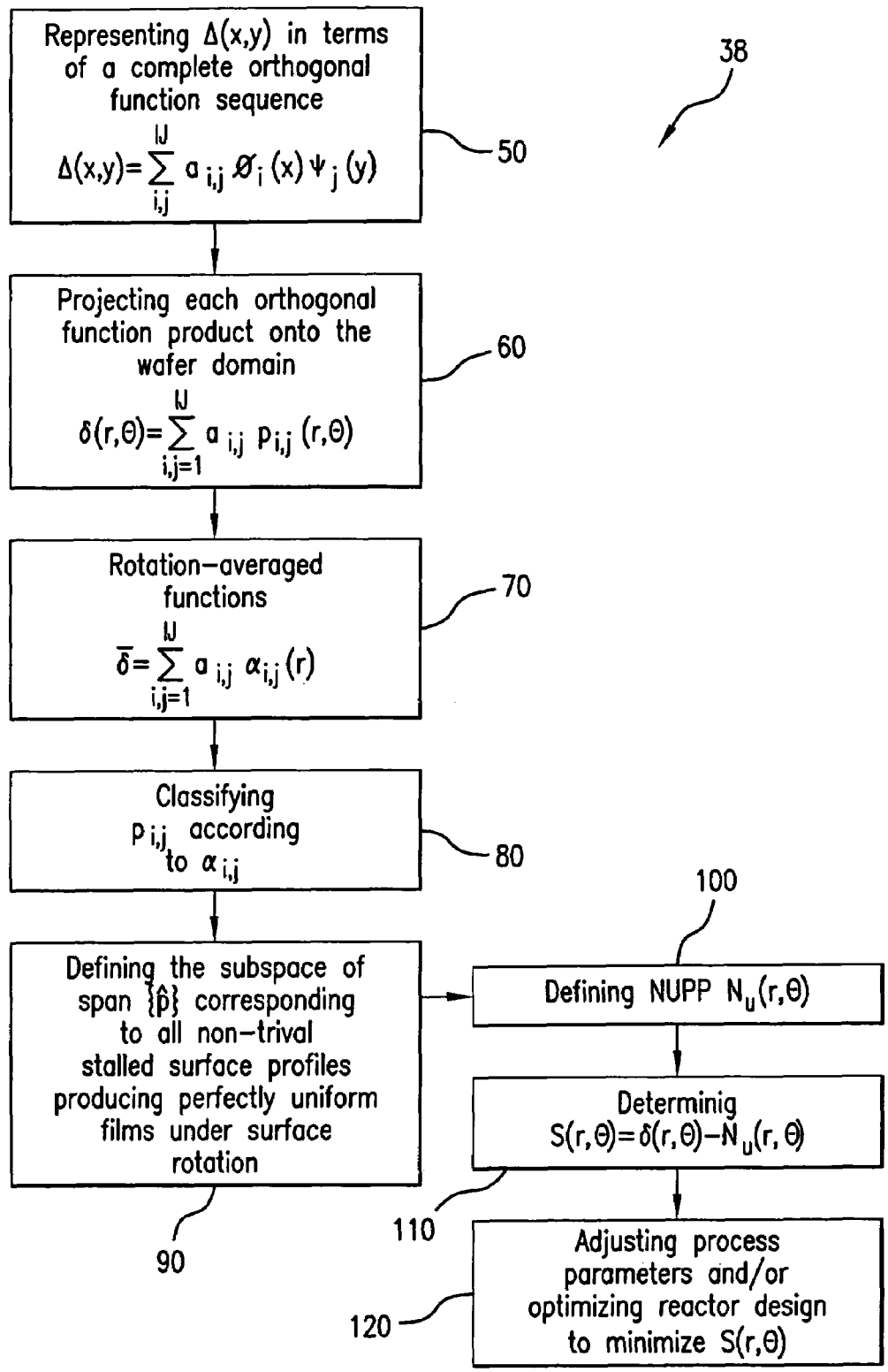
FIGS. 17 and 18 are flow chart diagrams of the sequence of steps underlying the operation of the thin film processing system of the present invention.

Referring to FIG. 17, representing a flow chart diagram of the software underlying the operation of the uniformity optimization and control unit 38, as well as the operation of the entire processing system 20 of the present invention, the procedure starts in block 50 "Representing $\Delta$ in Terms of a Complete Orthogonal Sequence" in which a film property $\Delta(x,y)$ which is to be made spatially uniform is defined in at least a portion of the physical domain of the reactor $\Omega(x, y)$ in accordance with Eq. 24.

The procedure further follows to the block 60 "Projecting Each Orthogonal Function Product onto the Wafer Domain," in which a distribution profile of the film property under optimization is found in the physical domain of the wafers, in accordance with the Eqs. 25, 26.

From block 60, the logic proceeds to block 70 "Rotation-Averaged Functions" in accordance with Eq. 27.

Further, the logic passes to block 80 "Classifying the $p_{i,j}$ according to the $\alpha_{i,j}$" to separate found $p_{i,j}$ and $\alpha_{i,j}$ into the subset $\{\rho^o\}_{n=1}^{n_o}$ corresponding to trivial (zero value) $\alpha_{i,j}$, subset $\{\bar{\rho}\}_{n=1}^{\bar{n}}$ corresponding to uniform and non-zero $\alpha_{i,j}$, and the set of $\{\hat{\rho}\}_{n=1}^{\hat{n}}$ corresponding to non-uniform and non-zero $\alpha_{i,j}$, e.g., the subspace that contains all non-uniformity producing profiles and some uniformity producing profiles requiring further analysis.

The procedure further flows to the block 90 "Defining the Subspace of span. ($\hat{p}$) Corresponding to All Non-Trivial Stalled Substrate Profiles Producing Perfectly Uniform Films Under Substrate Rotation". In this block the subroutine is performed shown in FIG. 18 to find all modes $\beta_n$ of the subspace of span ($\hat{p}$).

Figure 18:
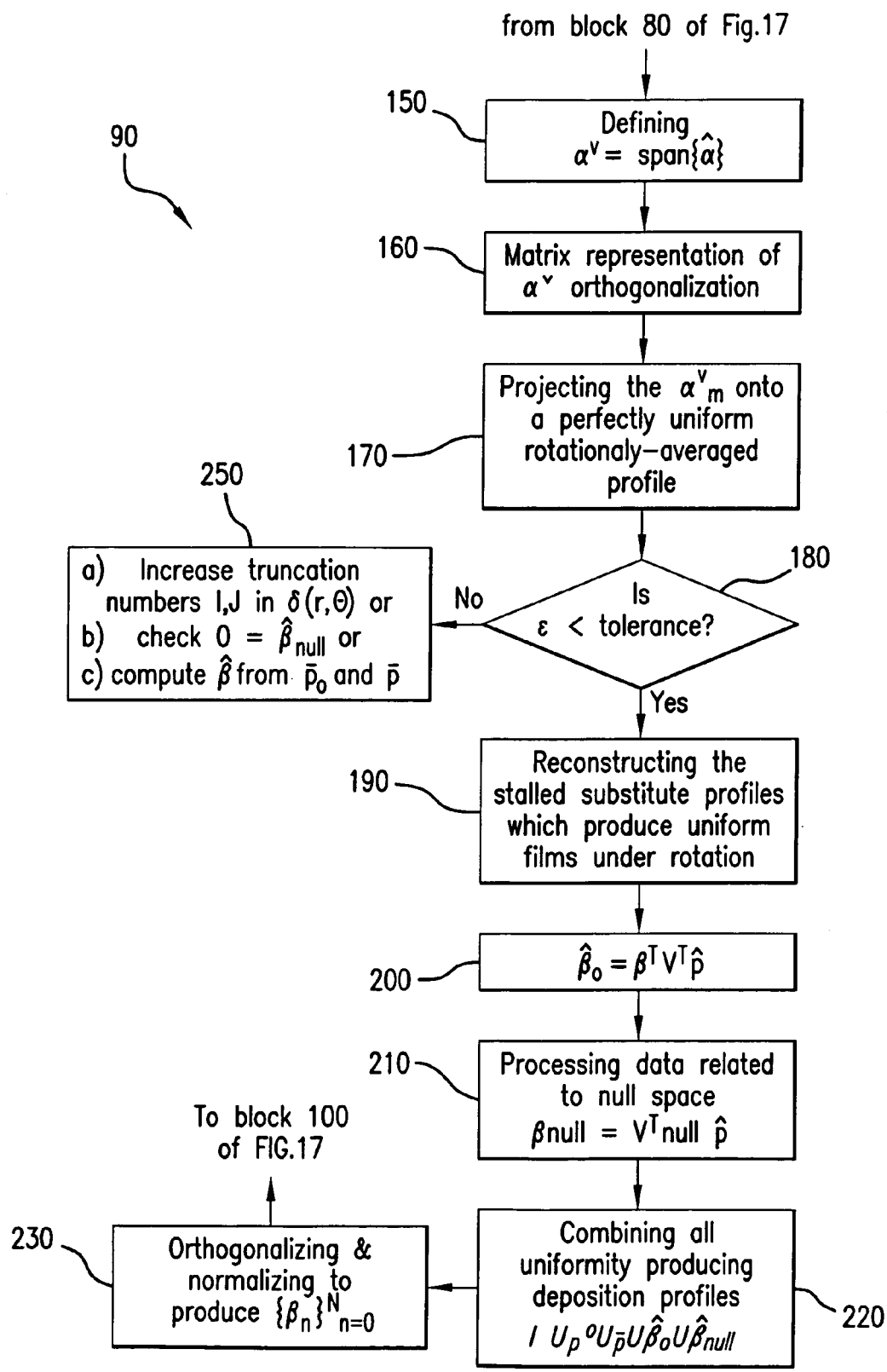

As shown in FIG. 18, the subroutine of the block 90 starts with "Defining the Sequence of Function $\alpha^{\nu}$" in block 150 where the set of $\alpha^{\nu}$ is computed using the Singular Value Decomposition procedure. Further, in block 160 "Matrix Representation of $\alpha^V$ Orthogonalization", the orthogonizational process is applied to the set of $\alpha^{\nu}$ to reduce redundant $\hat{a}$ and the process can be written in matrix form as presented by Eq. 29.

At this point of the subroutine, performed in block 170 "Projecting the $\alpha^{\nu}$ onto a Perfectly Uniform Rotationally Averaged Profile", the subspace of span ($\hat{p}$) corresponding to perfectly uniform profiles under rotation is determined by determining coefficients b by projecting the set of $\alpha_m^V$ on to a perfectly uniform rotationally averaged profile with numeric value 1 in accordance with Eq. 30.

The procedure further follows to logic block 180 "Is $\epsilon$<Tolerance?" where the $\epsilon$ is compared with a tolerance given by physical grounds related to the specific uniformity control problem. If $\epsilon$ is smaller than tolerance given by physical grounds, the stalled wafer profiles are reconstructed in block 190 using Eq. 31. Replacing each $\alpha_m$ in Eq. 31 above with its corresponding $\hat{p}_m$ generates the uniformity producing mode $\hat{\beta}_O$ in block 200 "$\hat{\beta}_o = b^T V^T \hat{\rho}$" in accordance with Eq. 32.

If however in block 180 $\epsilon$ is not smaller than the tolerance, the logic flows to block 250 in which three strategies can take place:

1. increase truncation numbers I and/or J in the sum of the basis function $\phi_i$ and $\psi_j$ defining $\Delta(x,y)$, e.g. the deposition profile over the entire susceptor, return to logical block 60, and repeat the entire procedure in blocks 60-180 to see if $\epsilon$ is sufficiently reduced;

2. if the strategy 1 is impossible to find sufficiently small, check to see if any $\hat{\beta}$ modes are generated by the null space of $V_{null}^T$ in block 210 of FIG. 18;

3. if both of the first and second strategies fail to produce any $\hat{\beta}$ modes, then compute the $\beta$ modes found from trivial (zero value) sub-space $p^o$ and from subspace of $\bar{p}$ corresponding to uniform and non-zero profiles under rotation.

The logic further flows to block 210 processing the data related to null space. For the null space of $V^T$, there also may be a corresponding stalled non-uniform profile which would produce a uniform profile on the substrate under rotation. A $\hat{\beta}_{null}$ is found in block 210 in accordance with Eq. 33.

From the block 210, the logic flows to block 220 "Combining All Uniformity Producing Deposition Profiles" where the space of all uniformity producing deposition profiles is formed in accordance with Eq. 34.

The logic further flows to block 230 "Orthogonalizing & Normalizing" to produce $\{\beta_n\}_{n=o}^N$ where the orthogalization and normalization of the combined space from block 220 is performed to remove redundant information thus producing the subspace of all uniformity producing deposition profiles $\beta_n$, thus defining the subspace of span ($\hat{p}$) corresponding to all non-trivial stalled wafer profiles that produce perfectly uniform films under wafer rotation. The representative $\beta_n$ modes are shown in FIG. 12.

From block 230, the procedure returns to the routine 38 of FIG. 17, particularly to block 100 "Defining NUPP" in which the Nearest Uniformity Producing Profile (NUPP) is computed using the projection operator by Eq. 36.

Particularly, in block 100, the combinations of modes $\beta_n$ which generate flat profiles on the substrate under rotation are further processed to generate a useful basis onto which a real deposition profile can be projected to determine whether the particular real deposition profile will generate uniform films under rotation, and, if it does not, predict the shape of the "nearest" profile that does.

The logic further proceeds to block 110 "Determining S(r, $\theta$)" where a measure of distance between the current deposition profile $\delta$ and its NUPP $N_u$ is determined in accordance with Eq. 37 and further is minimized as part of a simulation-based process recipe development procedure, or in a run-to-run control system. This criterion S depends only on the reactor and a wafer dimensions, and can be universally applied to any distributed film quality to be controlled, as well as any reaction and material system.

Using the formulated optimization criterion, it is possible not only to adjust the process parameters, but also to generate reactor designs that minimize the sensitivity of satisfying this criterion to design model and other errors by choosing design points where satisfaction of NUPP-based criterion is least sensitive to the most uncertain elements of the process model used for reactor design. Determining the NUPP function is shown to lead to physical insight on how reactor operating conditions should be adjusted to improve uniformity. NUPP functions with segments that are physically infeasible (such as negative deposition rate profiles) may indicate the reactor system is operating "far" from a feasible uniformity profile.

In order to minimize the optimization criterion S, the process parameter and/or reactor design parameters are adjusted which is accomplished in block 120. The adjusting of process parameters and/or optimization of reactor design in order to minimize $S(r,\theta)$ may be made in several ways. For example an approach to run-to-run control and optimization is developed which is based on a value of the thin film quality parameter under optimization:

1. measuring the desired film property of a wafer operated in stalled mode and determining the corresponding NUPP;
2. computing the sensitivity of both the most recent stalled-wafer profile and the corresponding NUPP with respect to the manipulated parameters using a process simulator to establish a search direction;
3. performing a line search (quantitative alteration of the parameter) along the computed direction, again using the simulator to determine the greatest reduction of the distance to the NUPP; and
4. update the process recipe accordingly.

Alternatively, the control problem can be posed as the nonlinear programming problem:

$$\min_{q} |\delta(r, \theta) - N_u(r, \theta)| \quad \text{(Eq. 39)}$$

subject to the constraints $q \geq qmin$ $q \leq qmax$ $Res(\delta(r,\theta))=0 \quad \text{(Eq. 40)}$ where Res is the residual function(s) of the process simulator.

To implement the uniformity optimization approach in a run-to-run control framework, planetary reactor systems featuring multiple satellite wafers may be run with a single stalled wafer that is sacrificed to obtain the measurements necessary to tune the tool to the desired operating point and to maintain its performance against drift and other disturbances. A single-wafer reactor uniformity control is achieved by operating the reactor in stalled wafer mode—this wafer's NUPP is computed and corrective control is applied to wafers that are subsequently processed in a rotating wafer mode. A stalled wafer is processed again only when the controlled film property falls out of specification or a major process change is implemented (e.g., process recipe adjustment or physical reactor modification).

Alternatively, a reactor susceptor design may have a recessed position 42 for a sacrificed member 44 (made as a strip or in any other appropriate shape) of the same material as the wafers 24 (as shown in FIG. 19). The advantage of this design is that all of the wafers 24 can be used for production and only a relatively small area is needed for the "monitoring strip." In this manner, expensive wafers are not sacrificed for measurements.

As presented in the subject patent application, the new approach to uniformity control in semiconductor and other thin film processes is developed for systems where substrates (e.g., wafers, optical components, etc.) rotation is used to improve uniformity. Based on a purely geometrical basis, the algorithm developed identifies all non-rotating substrate deposition profiles that result in uniform profiles under rotation. This permits the identification of the Nearest Uniformity Producing Profile (NUPP) of any given substrate profile, opening the door to a new approach to uniformity control. The new technique makes use of all available information (thus overcoming the inherent information loss that occurs as a result of the wafer rotation on post processing measurements). Finally, the proposed optimization and control approach to thin film uniformity improves the ad hoc and otherwise simplistic algorithms currently used to make use of full wafer maps. Planetary reactors, while modeled extensively and in detail, have not made use of such sophisticated run-to-run control strategies.

The NUPP-based uniformity control approach is applicable to any uniformity criterion in a wide range of thin film processing. Optimization, control, and design applications, including all CVD, etch, PVD, ALD, as well as other thin film processes with rotating substrate, such as, for example, film processing in semiconductor, optoelectronic, and optical coating industries benefit from this approach.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particularly locations of elements may be reversed or all without departing from the spirit or scope of the invention as defined in the appended claims.

What is being claimed is:

1. A method for improving uniformity of thin films formed in a thin film processing system, comprising the steps of:

providing a thin film processing system including at least one substrate operated in a stalled substrate mode and in a rotating substrate mode, said film processing system having process parameters and reactor design parameters;

providing a computer processing system operationally coupled to said film processing system;

identifying, in said computer processing system, at least one first distribution profile of at least one parameter of a thin film formed on said at least one substrate in said stalled substrate mode, said at least one first distribution profile producing a uniform second distribution profile of said thin film upon said at least one substrate rotation in said rotating substrate mode;

computing, in said computer processing system, a subspace of basis functions $\beta_n$ corresponding to said at least one first distribution profile in said stalled substrate mode generating said uniform second distribution profile in said rotating substrate mode;

formulating, in said computer processing system, a uniformity optimization criterion defined as a deviation of a deposition profile of said at least one parameter of the thin film formed on said at least one substrate in said stalled substrate mode thereof from said subspace of said basis functions $\beta_n$; and optimizing said film processing system to minimize said uniformity optimization criterion;

wherein the step of computing is followed by the step of:

forming, in said computer processing system, a Nearest Uniformity Producing Profile (NUPP) $N_u(r,\theta)$ based on said subspace of basis function $\beta_n$, wherein $$N_u(r, \theta) = \sum_{n=0}^{N} \beta_n(r, \theta) \int_0^{2\pi} \int_0^{r_\omega} \delta(r, \theta) \beta_n(r, \theta) r dr d\theta$$

wherein $\beta_n(r,\theta)$ is said basis function corresponding to said at least one first distribution profile, $\delta(r,\theta)$ is said deposition profile of said at least one parameter of the thin film formed on said at least one substrate in said stalled substrate mode, and r and $\theta$ are parameters of said at least one substrate physical domain $\omega(r,\theta)$; and calculating said uniformity optimization criterion $S(r,\theta)=\delta(r,\theta)-N_u(r,\theta)$ at a predetermined region of said thin film formed on said at least one substrate.

2. The method of claim 1, wherein the step of identifying includes the steps of:

projecting a sequence of orthogonal complete functions representing $\Delta(x, y)$ onto said physical domain $\omega(r,\theta)$ of said at least one substrate, wherein $\Delta(x, y)$ represents said at least one parameter of said thin film, thus defining the deposition profile $\delta(r,\theta)$ of said at least one parameter of the thin film formed on said at least one substrate is said stalled substrate mode, wherein $$\delta(r, \theta) = \sum_{i,j}^{I,J} a_{i,j} p_{i,j}(r, \theta)$$

wherein $p_{i,j}(r,\theta)$ are representation of said deposition profile $\delta(r,\theta)$ over said physical domain $\omega(r,\theta)$ of said at least one substrate, and $\alpha_{i,j}$ are contribution coefficients;

determining rotation—averaged functions $\bar{\delta}(r,\theta)$ corresponding to said $\delta(r,\theta)$, $$\text{wherein } \bar{\delta}(r, \theta) = R\delta(r, \theta) = \sum_{i,j=1}^{I,J} a_{i,j} \alpha_{i,j}(r),$$

wherein R is a rotationally—averaging operator, and $\alpha_{i,j}(r)$ are representations of rotationally averaged functions corresponding to said $p_{i,j}(r,\theta)$; and selecting a subset $\{\hat{p}\}_{n=1}^{n}$ of all said $p_{i,j}(r,\theta)$ corresponding to non-uniform and non-zero $\hat{\alpha}_{i,j}(r)$ from said $\alpha_{i,j}(r)$ for further computation.

3. The method of claim 2, where the step of selecting a subset is followed by the steps of:

defining a sequence of functions $\alpha^V = \text{span}\{\hat{\alpha}\}$;
orthogonalizing the $\alpha^V$;

determining a subspace span $\{\hat{p}\}$ corresponding to perfectly uniform profiles $\alpha_{i,j}(r)$ under rotation; and establishing uniformity producing modes $\{\beta_n\}_{n-0}^{N}$ of said subspace span $\{\hat{p}\}$ corresponding to all non-zero profiles of said at least one parameter of said thin film formed on said at least one substrate in said stalled substrate mode thereof producing uniform thin film upon rotation of said at least one substrate.

4. The method of claim 3, wherein the step of selecting a subset further includes the steps of:

forming a subset $\{p^0\}_{n=1}^{n_0}$ of all $p_{i,j}(r,\theta)$ corresponding to zero value $\alpha_{i,j}(r)$; and forming a subset $\{\bar{p}\}_{n=1}^{\bar{n}}$ of all $p_{i,j}(r,\theta)$ corresponding to uniform and non-zero $\alpha_{i,j}(r)$.

5. The method of claim 3, wherein said at least one parameter of the thin film is selected from the group consisting of thickness, composition, dopants level, microstructure, electrical properties, and morphology.

6. The method of claim 1, wherein the step of optimizing includes adjusting said process parameters, wherein said computer processing system generates process adjustment data.

7. The method of claim 1, wherein the step of optimizing includes optimizing said reactor design parameters, wherein said computer processing system generates reactor design optimization data.

8. The method of claim 1, wherein said thin film processing system is selected from the group consisting of chemical vapor deposition (CVD) systems, physical vapor deposition (PVD) systems, atomic layer deposition (ALD) systems, and etching systems.

9. The method of claim 1, wherein the step of optimizing said thin film processing system comprises the steps of:

measuring said at least one parameter of said thin film subsequent to deposition of said thin film;

determining said NUPP for said thin film;

computing sensitivity of said at least one parameter distribution profile and said NUPP using a process simulator, thereby establishing an optimization direction;

performing a quantative alteration of said film processing system in said optimization direction to obtain a greatest reduction of said uniformity criterion; and adjusting said film processing system to improve the uniformity of said at least one parameter to produce said uniform second distribution profile of the thin film in said rotating substrate mode.

10. The method of claim 9, wherein said at least one parameter is measured on said thin film formed on said at least one substrate in said stalled substrate mode.

11. The method of claim 9, wherein said thin film processing system includes a susceptor carrying said at least one substrate, and wherein the step of optimizing said thin film processing system further includes the steps of:

forming a recess at said susceptor;

positioning a sacrificial member in said recess, said sacrificial member being formed of a material identical to the material of said at least one substrate; and obtaining a value of said at least one parameter of said thin film by measuring said at least one parameter of the thin film formed on said sacrificial member.

12. A method for improving uniformity of thin films formed in a thin film processing system, comprising the steps of:

providing a thin film processing system including at least one substrate operated in a stalled substrate mode and in a rotating substrate mode;

providing a computer processing system operationally coupled to said thin film processing system;

identifying, in said computer processing system, at least one first distribution profile of at least one parameter of a thin film formed on said at least one substrate in said stalled substrate mode, said at least one first distribution profile producing a uniform second distribution profile of said thin film upon said at least one substrate rotation in said rotating substrate mode;

computing, in said computer processing system, a subspace of basis functions $\beta_n$ corresponding to said at least one first distribution profile in said stalled substrate mode generating said uniform second distribution profile in said rotating substrate mode;

forming a Nearest Uniformity Producing Profile (NUPP) $N_u(r,\theta)$ based on said subspace of basis function $\beta_n$ following the step of computing, wherein $$N_u(r, \theta) = \sum_{n=0}^{N} \beta_n(r, \theta) \int_0^{2\pi} \int_0^{r_\omega} \delta(r, \theta) \beta_n(r, \theta) r dr d\theta$$

wherein $\beta_n(r,\theta)$ is said basis function corresponding to said at least one fist distribution profile, $\delta(r,\theta)$ is a deposition profile of said at least one parameter of the thin film formed on said at least one substrate in said stalled substrate mode, and r and $\theta$ are parameters of said at least one substrate physical domain $\omega(r,\theta)$;

formulating, in said computer processing system, a uniformity optimization criterion $S(r,\theta) = \delta(r,\theta) - N_u(r,\theta)$ defined as a deviation of the deposition profile $\delta(r,\theta)$ of said at least one parameter of the thin film formed on said at least one substrate in said stalled mode thereof from said NUPP $N_u(r,\theta)$ at a predetermined region of said thin film; and minimizing said uniformity optimization criterion $S(r,\theta)$.

13. The method of claim 12, wherein said step of identifying includes the steps of:

projecting a sequence of orthogonal complete functions representing $\Delta(x, y)$ onto said physical domain $\omega(r,\theta)$ of said at least one substrate, wherein $\Delta(x, y)$ represents said at least one parameter of said thin film, thus defining the deposition profile $\delta(r,\theta)$ of said at least one parameter of the thin film formed on said at least one substrate is said stalled substrate mode:

$$\delta(r, \theta) = \sum_{i,j}^{I,J} a_{i,j} p_{i,j}(r, \theta)$$

wherein $p_{i,j}(r,\theta)$ are representation of said deposition profile $\delta(r,\theta)$ over said physical domain $\omega(r,\theta)$ of said at least one substrate, and $\alpha_{i,j}$ are contribution coefficients;

determining rotation—averaged functions $\bar{\delta}(r,\theta)$ corresponding to said $\delta(r,\theta)$, $$\text{wherein } \bar{\delta}(r, \theta) = R\delta(r, \theta) = \sum_{i,j=1}^{I,J} a_{i,j} \alpha_{i,j}(r),$$

wherein R is a rotationally—averaging operator, and $\alpha_{i,j}(r)$ are representations of rotationally averaged functions corresponding to said $p_{i,j}(r,\theta)$;

forming a subset $\{\hat{p}\}_{n=1}^{\hat{n}}$ of all said $p_{i,j}(r,\theta)$ corresponding to non-uniform and non-zero $\hat{\alpha}_{i,j}(r)$ from said $\alpha_{i,j}(r)$ for further computation;

forming a subset $\{p^0\}_{n=1}^{n_0}$ of all $p_{i,j}(r,\theta)$ corresponding to zero value $\alpha_{i,j}(r)$;

forming a subset $\{\bar{p}\}_{n=1}^{\bar{n}}$ of all $p_{i,j}(r,\theta)$ corresponding to uniform and non-zero $\alpha_{i,j}(r)$;

defining a sequence of functions $\alpha^V = \text{span}\{\alpha\}$;

orthogonalizing the $\alpha^V$;

determining a subspace span $\{\hat{p}\}$ corresponding to perfectly uniform second profiles $\alpha_{i,j}(r)$ under rotation; and establishing uniformity producing modes $\{\beta_n\}_{n-0}^N$ of said subspace span $\{\hat{p}\}$ corresponding to all non-zero profiles of said at least one parameter of said thin film formed on said at least one substrate in said stalled mode thereof producing perfectly uniform thin film upon rotation of said at least one substrate.

* * * * *